(12) United States Patent
Takahashi et al.

(10) Patent No.: US 7,652,281 B2
(45) Date of Patent: Jan. 26, 2010

(54) LIGHT EMITTING DIODE

(75) Inventors: Ken Takahashi, Mito (JP); Taichiroo Konno, Hitachi (JP); Masahiro Arai, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 130 days.

(21) Appl. No.: 11/848,709

(22) Filed: Aug. 31, 2007

(65) Prior Publication Data

US 2008/0083919 A1 Apr. 10, 2008

(30) Foreign Application Priority Data

Oct. 4, 2006 (JP) ............................. 2006-273298

(51) Int. Cl.
*H01L 33/00* (2006.01)

(52) U.S. Cl. ...................... 257/13; 257/79; 257/94; 257/103; 257/E27.111

(58) Field of Classification Search .................. 257/13, 257/79–103, 918, E51, E33, E25; 438/22–47, 438/69, 493, 503, 507, 956
See application file for complete search history.

(56) References Cited

U.S. PATENT DOCUMENTS

| 5,008,718 | A | | 4/1991 | Fletcher et al. |
| 5,153,889 | A | | 10/1992 | Sugawara et al. |
| 5,376,580 | A | | 12/1994 | Kish et al. |
| 5,502,316 | A | | 3/1996 | Kish et al. |
| 5,568,499 | A | * | 10/1996 | Lear ..................... 372/45.01 |
| 5,777,349 | A | | 7/1998 | Nakamura et al. |
| 5,856,682 | A | | 1/1999 | Sasaki |
| 5,981,976 | A | * | 11/1999 | Murasato ..................... 257/94 |
| 6,346,720 | B1 | * | 2/2002 | Iyechika et al. .............. 257/103 |
| 6,803,603 | B1 | * | 10/2004 | Nitta et al. ..................... 257/79 |
| 7,182,811 | B2 | * | 2/2007 | Ishida .......................... 117/91 |

FOREIGN PATENT DOCUMENTS

| JP | 3-171679 A | 7/1991 |
| JP | 5-335619 A | 12/1993 |
| JP | 3195194 B2 | 6/2001 |
| JP | 3233569 B2 | 9/2001 |
| JP | 3290672 B2 | 3/2002 |

OTHER PUBLICATIONS

T. Kato et al., "GaAs/GaAlAs surface emitting IR LED with Bragg reflector grown by MOCVD", Journal of Crystal Growth 107 (1991), pp. 832-835.

* cited by examiner

*Primary Examiner*—Wai-Sing Louie
*Assistant Examiner*—Sue Tang
(74) *Attorney, Agent, or Firm*—Foley & Lardner LLP

(57) ABSTRACT

On a GaAs substrate 1, a light emitting part 4, an intermediate layer 5 of AlGaInP and a current spreading layer 6 are sequentially formed. The light emitting part 4 includes a first conductivity type AlGaInP based lower cladding layer 41, an AlGaInP based light emitting layer 42, and a second conductivity type AlGaInP based upper cladding layer 43 sequentially formed on the GaAs substrate 1. In each layer of the light emitting part 4, a hydrogen concentration is not more than $2 \times 10^{17}$ cm$^{-3}$, a carbon concentration is not more than $2 \times 10^{16}$ cm$^{-3}$, and an oxygen concentration is not more than $2 \times 10^{16}$ cm$^{-3}$. In a partial region or in a total region of the current-spreading layer 6, a hydrogen concentration is not more than $5 \times 10^{17}$ cm$^{-3}$, a carbon concentration is not more than $5 \times 10^{17}$ cm$^{-3}$, and an oxygen concentration is not more than $2 \times 10^{16}$ cm$^{-3}$.

16 Claims, 5 Drawing Sheets

LIGHT EMITTING DIODE

The present application is based on Japanese Patent Application No. 2006-273298 filed on Oct. 4, 2006, the entire contents of which are incorporated herein by reference.

BACKGROUND OF THE INVENTION

1. Field of the Invention

The present invention relates to a light emitting diode using an AlGaInP based material for a light emitting layer.

2. Related Art

A light emitting diode using an AlGaInP based material for a light emitting layer is widely used, for example, as a light source for a display of household electric appliances or industrial apparatus, since it is possible to obtain a light emission wavelength band from yellow green to red by controlling a mixed crystal composition of the light emitting layer.

FIG. 6 is a schematic diagram showing a cross sectional view of a conventional light emitting diode. This light emitting diode 100 mainly comprises a GaAs single crystal substrate 101, a light emitting part 102 epitaxially grown on the GaAs single crystal substrate 101 by MOVPE (Metal Organic Vapor Phase Epitaxy), and a p-type current-spreading layer 103. A cathode electrode 104 is formed on a back surface (lower surface) of the GaAs single crystal substrate 101, and an anode electrode 105 is formed on a front surface (upper surface) of the current-spreading layer 103.

The light emitting part 102 has a double hetero structure (DH structure) comprising three layers, namely, an n-type lower cladding layer 1021, a light emitting layer 1022, and a p-type upper cladding layer 1023.

In a configuration of FIG. 6, by supplying an electric current between the cathode electrodes 104 and the anode electrode 105, a light emission is generated in the light emitting layer 1022, and the light is emitted to the outside mainly through the upper cladding layer 1023 and the current-spreading layer 103.

Conventionally, techniques for realizing the light emitting diode of the above configuration with a higher luminance have been studied. For example, U.S. Pat. No. 5,008,718 and Japanese Patent Laid-Open No. 3-171679 disclose a configuration in which a substantially transparent semiconductor material with respect to an emitting light of GaP, AlGaAs or the like is used for a current-spreading layer 103, so as to improve an efficiency of taking out the light. Japanese Patent No. 3290672 discloses a configuration in which a light emitting layer 1022 has a multiquantum well (MQW) structure so as to improve an internal quantum efficiency of a light emitting part 102.

Furthermore, U.S. Pat. No. 5,153,889 and Journal of Crystal Growth 107 (1991), pp. 832-835 disclose a configuration in which a Bragg reflection layer comprising a multilayer structure of semiconductor is provided between a GaAs single crystal substrate 101 and a light emitting part 102, and the Bragg reflection layer reflects the light emitted from the light emitting layer 1022 to a side of the GaAs single crystal substrate 101 back to a current-spreading layer 103 side.

In addition, it is important for the light emitting diode that a cost and a power consumption are low. For the case of the light emitting diode 100 having the configuration shown in FIG. 6, the light emitting part 102 generally comprises AlGaInP, GaInP, AlInP or the like, which is epitaxially grown with a mixed crystal composition having a lattice constant substantially equal to that of the GaAs. For example, when a GaP layer is epitaxially grown as the current-spreading layer 103 on the upper cladding layer 1023, deterioration in quality of a surface of the GaP layer and increase in a forward voltage may be caused, due to mismatch of the lattice constants of the upper cladding layer 1023 and the current-spreading layer 103 or a band discontinuity at an interface therebetween.

As a means for solving this problem, Japanese Patent No. 3233569 discloses a configuration in which an intermediate layer comprising GaInP or the like is formed between the upper cladding layer 1023 and the current-spreading layer 103.

Still further, little fall in luminance due to a long-term electrification and a high reliability are requested in the light emitting diode. It is known that the luminance falls when a dopant moves to the light emitting layer 1022 from the lower cladding layer 1021, the upper cladding layer 1023 and the current-spreading layer 103 in the light emitting diode 100 shown in FIG. 6. It is assumed that a penetration of the dopant is caused by a thermal history in the epitaxial growth of each layer composing the light emitting diode by using MOVPE method, and the electrification to the light emitting diode, and that the dopant moved to the light emitting layer 1022 causes a crystal defect in the light emitting layer 1022, which functions as a nonradiative recombination center of a carrier, thereby reducing the luminance.

As means for suppressing the penetration of the dopant as described above, a configuration in which an undoped cladding layer is provided between the upper cladding layer and the light emitting layer, or between the lower cladding layer and the light emitting layer is known, as disclosed by Japanese Patent No. 3195194 and U.S. Pat. No. 5,856,682. Further, a configuration in which a carrier concentration of the window layer provided as a current-spreading layer is lowered at a side of the light emitting part 4 is known, as disclosed by Japanese Patent Laid-Open No. 5-335619.

The above explanation mainly relates to the light emitting diode comprising a GaAs substrate and a crystal layer for a light emitting diode formed on the GaAs substrate. On the other hand, the light emitting diode having a configuration in which a substrate and a crystal layer for a light emitting diode are joined to each other is recently put into practical use. For example, as disclosed by U.S. Pat. No. 5,376,580 and U.S. Pat. No. 5,502,316, a technique for epitaxially growing a crystal layer on a GaAs substrate, joining another substrate to a surface of the crystal layer, and thereafter removing the GaAs substrate used for the epitaxial grown is known.

In addition, as an example of a junction structure between the substrate and the crystal layer, there is a configuration in which the substrate and the crystal layer are joined to each other via a metal layer and the metal layer also functions as the light reflecting layer. For this case, by composing the junction of a metal layer with a high reflectance, the luminance can be largely improved, compared with the aforementioned conventional light emitting diode comprising the GaAs substrate and the crystal layer epitaxially grown on the GaAs substrate.

However, according to the conventional light emitting diodes, since the effect of suppressing the penetration of the dopant into the light emitting layer is insufficient, there is a disadvantage in that the luminance falls after the long-term electrification. Further, in view of realizing the low power consumption, it is necessary to further reduce the forward voltage. Still further, since the light emitting diode is used for an exterior lamp for a vehicle or a signal apparatus, low power consumption is further required strongly in view of environment responsiveness as well as a high reliability is required.

SUMMARY OF THE INVENTION

Accordingly, an object of the invention is to provide an AlGaInP based light emitting diode in which a fall of the light emitting luminance is small, lower power consumption can be realized, and a high reliability can be obtained.

According to a first feature of the invention, a light emitting diode comprises:

a first conductivity type GaAs substrate;

a Bragg reflection layer comprising at least two kinds of materials having different Al compositions, each of which is selected from a first conductivity type $Al_{x0}Ga_{1-x0}As$ ($0 \leq x0 \leq 1$);

a lower cladding layer comprising a first conductivity type $(Al_{x1}Ga_{1-x1})_{y1}In_{1-y1}P$ ($0 \leq x1 \leq 1$, $0.4 \leq y1 \leq 0.6$);

a light emitting layer having a multiquantum well structure comprising an $(Al_{x2}Ga_{1-x2})_{y2}In_{1-y2}P$ ($0 \leq x2 \leq 1$, $0.4 \leq y2 \leq 0.6$);

an upper cladding layer comprising a second conductivity type $(Al_{x3}Ga_{1-x3})_{y3}In_{1-y3}P$ ($0 \leq x3 \leq 1$, $0.4 \leq y3 \leq 0.6$); and a current spreading layer comprising a second conductivity type GaP layer;

wherein a first hydrogen concentration is not more than $2 \times 10^{17}$ cm$^{-3}$, a first carbon concentration is not more than $2 \times 10^{16}$ cm$^{-3}$, and a first oxygen concentration is not more than $2 \times 10^{16}$ cm$^{-3}$ in each of the lower cladding layer, the light emitting layer, and the upper cladding layer, and a second hydrogen concentration is not more than $5 \times 10^{17}$ cm$^{-3}$, a second carbon concentration is not more than $5 \times 10^{17}$ cm$^{-3}$, and a second oxygen concentration is not more than $2 \times 10^{16}$ cm$^{-3}$ in a partial region or in a total region of the current-spreading layer.

According to a second feature of the invention, a light emitting diode comprises:

a first conductivity type GaAs substrate;

a Bragg reflection layer comprising at least two kinds of materials having different Al compositions, each of which is selected from a first conductivity type $(Al_{x4}Ga_{1-x4})_{y4}In_{1-y4}P$ ($0 \leq x4 \leq 1$, $0.4 \leq y4 \leq 0.6$);

a lower cladding layer comprising a first conductivity type $(Al_{x1}Ga_{1-x1})_{y1}In_{1-y1}P$ ($0 \leq x1 \leq 1$, $0.4 \leq y1 \leq 0.6$);

a light emitting layer having a multiquantum well structure comprising an $(Al_{x2}Ga_{1-x2})_{y2}In_{1-y2}P$ ($0 \leq x2 \leq 1$, $0.4 \leq y2 \leq 0.6$);

an upper cladding layer comprising a second conductivity type $(Al_{x3}Ga_{1-x3})_{y3}In_{1-y3}P$ ($0 \leq x3 \leq 1$, $0.4 \leq y3 \leq 0.6$); and a current spreading layer comprising a second conductivity type GaP layer;

wherein a first hydrogen concentration is not more than $2 \times 10^{17}$ cm$^{-3}$, a first carbon concentration is not more than $2 \times 10^{16}$ cm$^{-3}$, and a first oxygen concentration is not more than $2 \times 10^{16}$ cm$^{-3}$ in each of the lower cladding layer, the light emitting layer, and the upper cladding layer, and a second hydrogen concentration is not more than $5 \times 10^{17}$ cm$^{-3}$, a second carbon concentration is not more than $5 \times 10^{17}$ cm$^{-3}$, and a second oxygen concentration is not more than $2 \times 10^{16}$ cm$^{-3}$ in a partial region or in a total region of the current-spreading layer.

According to a third feature of the invention, a light emitting diode comprises:

a first conductivity type GaAs substrate;

a Bragg reflection layer comprising materials selected from a first conductivity type $Al_{x5}Ga_{1-x5}As$ ($0 \leq x5 \leq 1$) and a first conductivity type $(Al_{x6}Ga_{1-x6})_{y6}In_{1-y6}P$ ($0 \leq x6 \leq 1$, $0.4 \leq y6 \leq 0.6$);

a lower cladding layer comprising a first conductivity type $(Al_{x1}Ga_{1-x1})_{y1}In_{1-y1}P$ ($0 \leq x1 \leq 1$, $0.4 \leq y1 \leq 0.6$);

a light emitting layer having a multiquantum well structure comprising an $(Al_{x2}Ga_{1-x2})_{y2}In_{1-y2}P$ ($0 \leq x2 \leq 1$, $0.4 \leq y2 \leq 0.6$);

an upper cladding layer comprising a second conductivity type $(Al_{x3}Ga_{1-x3})_{y3}In_{1-y3}P$ ($0 \leq x3 \leq 1$, $0.4 \leq y3 \leq 0.6$); and a current spreading layer comprising a second conductivity type GaP layer;

wherein a first hydrogen concentration is not more than $2 \times 10^{17}$ cm$^{-3}$, a first carbon concentration is not more than $2 \times 10^{16}$ cm$^{-3}$, and a first oxygen concentration is not more than $2 \times 10^{16}$ cm$^{-3}$ in each of the lower cladding layer, the light emitting layer, and the upper cladding layer, and a second hydrogen concentration is not more than $5 \times 10^{17}$ cm$^{-3}$, a second carbon concentration is not more than $5 \times 10^{17}$ cm$^{-3}$, and a second oxygen concentration is not more than $2 \times 10^{16}$ cm$^{-3}$ in a partial region or in a total region of the current-spreading layer.

According to a fourth feature of the invention, the light emitting diode further comprises:

an intermediate layer provided between the upper cladding layer and the current-spreading layer, the intermediate layer comprising $(Al_{x7}Ga_{1-x7})_{y7}In_{1-y7}P$ ($0 \leq x7 \leq 1$, $0 \leq y7 \leq 1$) doped with a second conductivity type dopant having a concentration higher than that of a second conductivity type dopant in the upper cladding layer;

wherein a third hydrogen concentration is not more than $1 \times 10^{18}$ cm$^{-3}$, a third carbon concentration is not more than $1 \times 10^{18}$ cm$^{-3}$, and a third oxygen concentration is not more than $5 \times 10^{16}$ cm$^{-3}$ in the intermediate layer.

According to a fifth feature of the invention, in the light emitting diode, the concentration of the second conductivity type dopant of the intermediate layer may be not less than $5 \times 10^{17}$ cm$^{-3}$, and the intermediate layer further includes a first conductivity type dopant having a concentration lower than that of the second conductivity type dopant.

According to a sixth feature of the invention, a light emitting diode comprises:

an n-type GaAs substrate;

a Bragg reflection layer comprising at least two kinds of materials having different Al compositions, each of which is selected from an n-type $Al_{x0}Ga_{1-x0}As$ ($0 \leq x0 \leq 1$);

a lower cladding layer comprising an n-type $(Al_{x1}Ga_{1-x1})_{y1}In_{1-y1}P$ ($0 \leq x \leq 1$, $0.4 \leq y1 \leq 0.6$);

a light emitting layer having a multiquantum well structure comprising an $(Al_{x2}Ga_{1-x2})_{y2}In_{1-y2}P$ ($0 \leq x2 \leq 1$, $0.4 \leq y2 \leq 0.6$);

an upper cladding layer comprising a Mg-doped p-type $(Al_{x3}Ga_{1-x3})_{y3}In_{1-y3}P$ ($0 \leq x3 \leq 1$, $0.4 \leq y3 \leq 0.6$); and a current spreading layer comprising a Mg-doped p-type GaP layer;

wherein a first hydrogen concentration is not more than $2 \times 10^{17}$ cm$^{-3}$, a first carbon concentration is not more than $2 \times 10^{16}$ cm$^{-3}$, and a first oxygen concentration is not more than $2 \times 10^{16}$ cm$^{-3}$ in each of the lower cladding layer, the light emitting layer, and the upper cladding layer, and a second hydrogen concentration is not more than $5 \times 10^{17}$ cm$^{-3}$, a second carbon concentration is not more than $5 \times 10^{17}$ cm$^{-3}$, and a second oxygen concentration is not more than $2 \times 10^{16}$ cm$^{-3}$ in a partial region or in a total region of the current-spreading layer.

According to a seventh feature of the invention, a light emitting diode comprises:

an n-type GaAs substrate;

a Bragg reflection layer comprising at least two kinds of materials having different Al compositions, each of which is selected from an n-type $(Al_{x4}Ga_{1-x4})_{y4}In_{1-y4}P$ ($0 \leq x4 \leq 1$, $0.4 \leq y4 \leq 0.6$);

a lower cladding layer comprising an n-type $(Al_{x1}Ga_{1-x1})_{y1}In_{1-y1}P$ ($0 \leq x1 \leq 1$, $0.4 \leq y1 \leq 0.6$);

a light emitting layer having a multiquantum well structure comprising an $(Al_{x2}Ga_{1-x2})_{y2}In_{1-y2}P$ ($0 \leq x2 \leq 1$, $0.4 \leq y2 \leq 0.6$);

an upper cladding layer comprising a Mg-doped p-type $(Al_{x3}Ga_{1-x3})_{y3}In_{1-y3}P$ ($0 \leq x3 \leq 1$, $0.4 \leq y3 \leq 0.6$); and a current spreading layer comprising a Mg-doped p-type GaP layer;

wherein a first hydrogen concentration is not more than $2 \times 10^{17}$ cm$^{-3}$, a first carbon concentration is not more than $2 \times 10^{16}$ cm$^{-3}$, and a first oxygen concentration is not more than $2 \times 10^{16}$ cm$^{-3}$ in each of the lower cladding layer, the light emitting layer, and the upper cladding layer, and a second hydrogen concentration is not more than $5 \times 10^{17}$ cm$^{-3}$, a second carbon concentration is not more than $5 \times 10^{17}$ cm$^{-3}$, and a second oxygen concentration is not more than $2 \times 10^{16}$ cm$^{-3}$ in a partial region or in a total region of the current-spreading layer.

According to an eighth feature of the invention, a light emitting diode comprises:

an n-type GaAs substrate;

a Bragg reflection layer comprising materials selected from an n-type $Al_{x5}Ga_{1-x5}As$ ($0 \leq x5 \leq 1$) and an n-type $(Al_{x6}Ga_{1-x6})_{y6}In_{1-y6}P$ ($0 \leq x6 \leq 1$, $0.4 \leq y6 \leq 0.6$);

a lower cladding layer comprising an n-type $(Al_{x1}Ga_{1-x1})_{y1}In_{1-y1}P$ ($0 \leq x1 \leq 1$, $0.4 \leq y1 \leq 0.6$);

a light emitting layer having a multiquantum well structure comprising an $(Al_{x2}Ga_{1-x2})_{y2}In_{1-y2}P$ ($0 \leq x2 \leq 1$, $0.4 \leq y2 \leq 0.6$);

an upper cladding layer comprising a Mg-doped p-type $(Al_{x3}Ga_{1-x3})_{y3}In_{1-y3}P$ ($0 \leq x3 \leq 1$, $0.4 \leq y3 \leq 0.6$); and a current spreading layer comprising a Mg-doped p-type GaP layer;

wherein a first hydrogen concentration is not more than $2 \times 10^{17}$ cm$^{-3}$, a first carbon concentration is not more than $2 \times 10^{16}$ cm$^3$, and a first oxygen concentration is not more than $2 \times 10^{16}$ cm$^{-3}$ in each of the lower cladding layer, the light emitting layer, and the upper cladding layer, and a second hydrogen concentration is not more than $5 \times 10^{17}$ cm$^{-3}$, a second carbon concentration is not more than $5 \times 10^{17}$ cm$^{-3}$, and a second oxygen concentration is not more than $2 \times 10^{16}$ cm$^{-3}$ in a partial region or in a total region of the current-spreading layer.

According to a ninth feature of the invention, the light emitting diode further comprises:

an intermediate layer provided between the upper cladding layer and the current-spreading layer, the intermediate layer comprising $(Al_{x7}Ga_{1-x7})_{y7}In_{1-y7}P$ ($0 \leq x7 \leq 1$, $0 \leq y7 \leq 1$) doped with Mg to have a Mg concentration higher than that in the upper cladding layer;

wherein a third hydrogen concentration is not more than $1 \times 10^{18}$ cm$^{-3}$, a third carbon concentration is not more than $1 \times 10^{18}$ cm$^{-3}$, and a third oxygen concentration is not more than $5 \times 10^{16}$ cm$^{-3}$ in the intermediate layer.

According to a tenth feature of the invention, in the light emitting diode, the intermediate layer includes at least one element selected from a group consisting of Si, Se, and Te as an n-type dopant, and a total of n-type dopant concentration is not less than $5 \times 10^{17}$ cm$^{-3}$ as well as lower than the Mg concentration.

According to an eleventh feature of the invention, a light emitting diode comprises:

a conductive substrate;

a multilayered crystal layer comprising a plurality of compound semiconductor crystal layers joined with the conductive substrate via a metal layer, the multilayered crystal layer comprising:

a lower cladding layer comprising a first conductivity type $(Al_{x1}Ga_{1-x1})_{y1}In_{1-y1}P$ ($0 \leq x1 \leq 1$, $0.4 \leq y1 \leq 0.6$);

a light emitting layer having a multiquantum well structure comprising an $(Al_{x2}Ga_{1-x2})_{y2}In_{1-y2}P$ ($0 \leq x2 \leq 1$, $0.4 \leq y2 \leq 0.6$); and an upper cladding layer comprising a second conductivity type $(Al_{x3}Ga_{1-x3})_{y3}In_{1-y3}P$ ($0 \leq x3 \leq 1$, $0.4 \leq y3 \leq 0.6$), sequentially deposited from a side in vicinity of the conductive substrate; and wherein a hydrogen concentration is not more than $2 \times 10^{17}$ cm$^{-3}$, a carbon concentration is not more than $2 \times 10^{16}$ cm$^{-3}$, and an oxygen concentration is not more than $2 \times 10^{16}$ cm$^{-3}$ in each of the lower cladding layer, the light emitting layer, and the upper cladding layer.

According to a twelfth feature of the invention, the light emitting diode further comprises:

a first conductivity type GaP layer provided between the conductive substrate and the lower cladding layer, wherein a hydrogen concentration is not more than $5 \times 10^{17}$ cm$^{-3}$, a carbon concentration is not more than $5 \times 10^{17}$ cm$^{-3}$, and an oxygen concentration is not more than $2 \times 10^{16}$ cm$^{-3}$ in at least a partial region of the GaP layer.

According to a thirteenth feature of the invention, the light emitting diode further comprises:

an intermediate layer provided between the GaP layer and the lower cladding layer, the intermediate layer comprising $(Al_{x7}Ga_{1-x7})_{y7}In_{1-y7}P$ ($0 \leq x7 \leq 1$, $0 \leq y7 \leq 1$) doped with a first conductivity type dopant having a concentration higher than that of a first conductivity type dopant in the lower cladding layer;

wherein a hydrogen concentration is not more than $1 \times 10^{18}$ cm$^{-3}$, a carbon concentration is not more than $1 \times 10^{18}$ cm$^{-3}$, and an oxygen concentration is not more than $5 \times 10^{16}$ cm$^{-3}$ in the GaP layer.

According to a fourteenth feature of the invention, in the light emitting diode, the concentration of the first conductivity type dopant of the intermediate layer is not less than $5 \times 10^{17}$ cm$^{-3}$, and the intermediate layer further includes a second conductivity type dopant having a concentration lower than that of the first conductivity type dopant.

According to a fifteenth feature of the invention, in the light emitting diode, the conductive substrate comprises a material selected from a group consisting of Si, GaAs and Cu.

According to a sixteenth feature of the invention, a light emitting diode comprises:

a conductive substrate;

a light emitting part comprising:

a first conductivity type AlGaInP based lower cladding layer;

a light emitting layer having an AlGaInP based multiquantum well structure; and a second conductivity type AlGaInP based upper cladding layer;

wherein a hydrogen concentration is not more than $2 \times 10^{17}$ cm$^{-3}$, a carbon concentration is not more than $2 \times 10^{16}$ cm$^{-3}$, and an oxygen concentration is not more than $2 \times 10^{16}$ cm$^{-3}$ in each of the lower cladding layer, the light emitting layer, and the upper cladding layer.

According to the present invention, it is possible to provide an AlGaInP based light emitting diode in which the fall of the light emitting luminance is small, the lower power consumption can be realized, and the high reliability can be obtained.

BRIEF DESCRIPTION OF THE DRAWINGS

The present invention will be explained in more detail in conjunction with appended drawings, wherein.

DETAILED DESCRIPTION OF THE PREFERRED EMBODIMENTS

First Preferred Embodiment (Configuration of a Light Emitting Diode)

Figure 1:
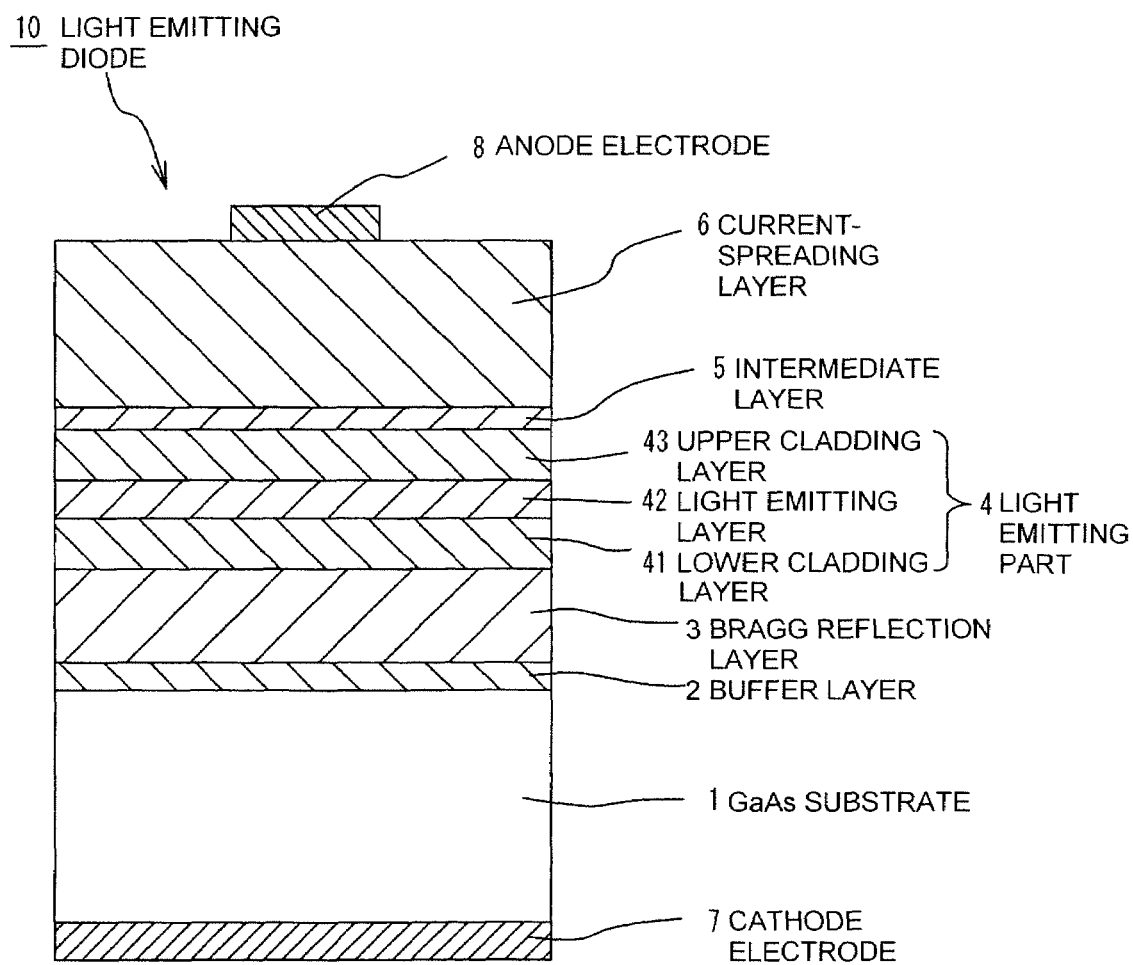
FIG. 1 is a schematic cross sectional view of a light emitting diode in a first preferred embodiment according to the present invention.

FIG. 1 is a schematic cross sectional view of a light emitting diode in the first preferred embodiment according to the present invention.

A light emitting diode 10 comprises an n-type GaAs substrate 1, an n-type GaAs buffer layer 2, an n-type Bragg reflection layer 3, a light emitting part 4, a p-type intermediate layer 5, and a p-type current-spreading layer 6, respective crystal layers 2 to 6 being sequentially formed on the n-type GaAs substrate 1 by MOVPE method, a cathode electrode 7 formed on an opposite surface (back surface) of the n-type GaAs substrate 1 with respect to the light emitting part 4, and an anode electrode 8 formed on an opposite surface (front surface) of the current-spreading layer 6 with respect to the light emitting part 4.

The light emitting part 4 comprises a lower cladding layer 41, a light emitting layer 42 and an upper cladding layer 43, sequentially formed on the Bragg reflection layer 3.

For example, the lower cladding layer 41 comprises an n-type $(Al_xGa_{1-x})_yIn_{1-y}P$ layer ($0 \leq x \leq 1$, $0.4 \leq y \leq 0.6$).

For example, the light emitting layer 42 comprises an $(Al_xGa_{1-x})_yIn_{1-y}P$ ($0 \leq x \leq 1$, $0.4 \leq y \leq 0.6$) MQW layer.

For example, the upper cladding layer 43 comprises a Mg-doped p-type $(Al_xGa_{1-x})_yIn_{1-y}P$ ($0 \leq x \leq 1$, $0.4 \leq y \leq 0.6$) layer.

The reason for defining concentration ranges of hydrogen, carbon and oxygen in the present invention as described above will be explained below.

The Inventors of the present invention studied in detail and continuously about a relationship between an impurity concentration and an amount of the dopant moved to the light emitting layer 42, since they assumed that the amount of the dopant moved from the intermediate layer 5, the current-spreading layer 6, the lower cladding layer 41 and the like to the light emitting layer 42 and the upper cladding layer 43 would be affected by quality of the respective doped crystal layers (epitaxial layer), due to the thermal history of epitaxial growth of the respective crystal layers by the MOVPE method or the electrification to the light emitting diode 10. As a result, it was found that the amount of the dopant moved to the light emitting layer 42 strongly depends on the concentrations of the hydrogen, the carbon and the oxygen in the respective crystal layers rather than the dopant concentration in each of the intermediate layer 5, the current-spreading layer 6, the lower cladding layer 41 and the upper cladding layer 43.

It is assumed that the hydrogen, the carbon and the oxygen are not intentionally doped, but taken into each crystal layer from a source gas or an atmosphere gas in the epitaxial growth by the MOVPE method. Therefore, after analysis in depth of the epitaxial growth conditions using the MOVPE method, they found a growth condition for controlling the concentrations of the hydrogen, carbon and oxygen that are taken into the respective crystal layers.

In each of the lower cladding layer 41, the light emitting layer 42, and the upper cladding layer 43, a concentration of hydrogen is not more than $2 \times 10^{17}$ cm$^{-3}$, a concentration of carbon (C) is not more than $2 \times 10^{16}$ cm$^{-3}$, and a concentration of oxygen (O) is not more than $2 \times 10^{16}$ cm$^{\times 3}$. In the current-spreading layer 6, the concentration of the hydrogen is not more than $5 \times 10^{17}$ cm$^{-3}$, the concentration of the carbon is not more than $5 \times 10^{17}$ cm$^{-3}$, and the concentration of the oxygen is not more than $2 \times 10^{16}$ cm$^{-3}$. In the intermediate layer 5, the concentration of the hydrogen is not more than $1 \times 10^{18}$ cm$^{-3}$, the concentration of the carbon is not more than $1 \times 10^{18}$ cm$^{-3}$, and the concentration of the oxygen is not more than $5 \times 10^{16}$ cm$^{-3}$. According to this structure, it is possible to suppress the amount of the dopant moved from each crystal layer to the light emitting layer 42 to be extremely low, thereby realizing an AlGaInP based light emitting diode, in which an initial light emitting luminance is high and the fall of the light emitting luminance due to the electrification is extremely small.

In order to reduce a forward voltage of the light emitting diode 10 in the electrification, it is necessary to reduce a voltage loss in the intermediate layer 5. It is assumed that this voltage loss is caused by band-edge discontinuity at an interface between the current-spreading layer 6 and the intermediate layer 5, and an interface between the intermediate layer 5 and the upper cladding layer 43. As means for avoiding this problem, a technique of increasing a tunnel current in each band-edge discontinuity by increasing a concentration of the dopant used for controlling a conductivity type of the intermediate layer 5, for example, to be not less than $3 \times 10^{18}$ cm$^{-3}$ was effective. The tunnel current tends to increase in accordance with the increase in the doping amount. However, when the doping amount of the intermediate layer 5 is increased, for example, to be $1 \times 10^{19}$ cm$^{-3}$, a surface quality of the crystal layer is deteriorated and a yield of the light emitting diode 10 is lowered.

Then the Inventors of the present invention studied to further reduce the voltage loss in the intermediate layer 5 by doping other impurity to the intermediate layer 5 as well as the dopant for controlling the conductivity type. As a result, as described above, it was possible to largely reduce the voltage loss in the intermediate layer 5 by doping a dopant of a second conductivity type to have a concentration of not less than $5 \times 10^{17}$ cm$^{-3}$.

The current-spreading layer 6 comprises a Mg-doped p-type GaP layer.

(Method for Fabricating a Light Emitting Diode)

At first, AlGaInP based crystal layers such as AlGaInP layer, GaInP, AlInP, GaP and the like are epitaxially grown on the GaAs substrate 1 by MOVPE method. For this case, III group element source comprising an organic metal material such as trimethyl gallium (TMG), trimethylaluminum (TMA), trimethyl indium (TMI) and the like is used as a growth material. In addition, as a V group element source, phosphine (PH$_3$) which is a metal hydride gas may be used.

In the AlGaInP based light emitting diode 10, an AlGaAs based crystal layer such as GaAs, AlGaAs and the like may be also used as the Bragg reflection layer 3 and the current-spreading layer 6. For this case, the III group element source is the same as the AlGaInP based crystal layer, and arsine (AsH$_3$) which is a metal hydride gas may be mainly used as the V group element source.

Vapor of the aforementioned organic metal material and the metal hydride gas are sent to a reaction chamber of a MOVPE apparatus by using a hydrogen gas as a carrier gas. The reaction chamber is equipped with a susceptor and a heating mechanism, and the GaAs substrate 1 is installed on a predetermined position of the susceptor then heated. In the growth of the crystal layers of the AlGaInP based light emitting diode, a temperature of the GaAs substrate 1 is generally from 600° C. to 750° C. The Source gas sent to the reaction chamber is decomposed by heat, and a reaction product of the source gas is epitaxially grown on the GaAs substrate 1 as the AlGaInP based compound or the AlGaAs based compound.

As a dopant element for controlling the crystal layer to have a p-type conductivity, Mg and Zn are mainly used, and bis(cyclopentadienyl)magnesium (Cp$_2$Mg), dimethylzinc (DMZn), diethylzinc (DEZn) and the like are mainly used as a source thereof. In addition, as a dopant element for controlling the crystal layer to have an n-type conductivity, Te, Se, and Si are mainly used, and dimethyl tellurium (DMTe), diethyl tellurium (DETe), hydrogen selenide (H$_2$Se), disilane (Si$_2$H$_6$), monosilane (SiH$_4$) and the like are mainly used as a source thereof. The dopant source is supplied approximately simultaneously with III group element source and the V group element source to the reaction chamber.

The light emitting diode 10 comprises a plurality of crystal layers as shown in FIG. 1, and the respective crystal layers are epitaxially grown sequentially in order starting from the buffer layer 2 provided at a side of GaAs substrate 1. In the growth of the respective crystal layers, necessary III group element source, V group element source and dopant source are selected, and supplied at a predetermined flow rate to the reaction chamber.

(Concentrations of Hydrogen, Carbon, Oxygen and Dopant)

It is assumed that the hydrogen and the carbon existing in the current-spreading layer, the intermediate layer, the upper cladding layer, the lower cladding layer and the like epitaxially grown by the MOVPE method are taken from the III group element source and the V group element source that are not yet decomposed to each crystal layer. In addition, concerning the oxygen, it is assumed that moisture content and the oxygen remaining on inner walls of the reaction chamber and a susceptor surface are taken into the crystal layer.

It is assumed that the hydrogen, carbon and oxygen existing in the current-spreading layer, the intermediate layer, the upper cladding layer, the lower cladding layer and the like generate a certain kind of crystal defect in each crystal layer, so that the dopant moves through the crystal defect when a thermal energy is applied to each crystal layer, or the electron or hole is injected into each crystal layer. It is necessary to provide appropriate concentrations (lower than predetermined concentrations) of the hydrogen, carbon and oxygen respectively in each crystal layer, in order to prevent the penetration of the dopant.

In the epitaxial growth, the concentrations of the hydrogen, carbon and oxygen taken into each crystal layer depend upon the growth condition of the crystal layer. For example, the hydrogen concentration mainly and strongly depends upon a temperature of GaAs substrate 1, and the hydrogen concentration tends to decrease in accordance with elevation of the temperature. In addition, after the growth of the crystal layer, the hydrogen concentration tends to decrease in accordance with en elapse of the time for keeping a temperature of GaAs substrate 1 not less than 300° C. On the other hand, the carbon concentration and the oxygen concentration are affected by the temperature, however, they rather depends upon a ratio of a mol concentration of the V group element source to a mol concentration of the III group element source to be supplied to the reaction chamber (hereinafter referred as "V/III ratio") strongly. In concrete, the concentrations of the carbon and oxygen tend to decrease in accordance with the increase in the V/III ratio.

In the lower cladding layer 41, the light emitting layer 42, and the upper cladding layer 43, it is controlled that the hydrogen concentration is not more than $2\times10^{17}$ cm$^{-3}$, the carbon concentration is not more than $2\times10^{16}$ cm$^{-3}$, and the oxygen concentration is not more than $2\times10^{16}$ cm$^{-3}$. In the current-spreading layer 6, it is controlled that the hydrogen concentration is not more than $5\times10^{17}$ cm$^{-3}$, the carbon concentration is not more than $5\times10^{17}$ cm$^{-3}$, and the oxygen concentration is not more than $2\times10^{16}$ cm$^{-3}$. In the intermediate layer 5, it is controlled that the hydrogen concentration is not more than $1\times10^{18}$ cm$^{-3}$, the carbon concentration is not more than $1\times10^{18}$ cm$^{-3}$, and the oxygen concentration is not more than $5\times10^{16}$ cm$^{-3}$. According to this structure, it is possible to suppress the amount of the dopant moved from each crystal layer to the light emitting layer 42 to be extremely low. Herein, the concentration of the dopant moved to the light emitting layer 42 is measured after the epitaxial growth and after conducting the electrification test to the light emitting diode thus fabricated.

When both the concentration of the dopant moved to the light emitting layer measured after the epitaxial growth and the concentration of the dopant moved to the light emitting layer measured after the electrification test are not more than $1\times10^{16}$ cm$^{-3}$, the initial light emitting luminance is high and the light emitting luminance after the electrification test does not fall. When the concentration of the dopant moved to the light emitting layer 42 measured after the epitaxial growth is not less than $2\times10^{16}$ cm$^{-3}$, the initial light emitting luminance is significantly decreased. On the other hand, when a significant fall of the light emitting luminance after the electrification test is observed while the concentration of the dopant moved to the light emitting layer measured after the epitaxial growth is not more than $2\times10^{16}$ cm$^{-3}$ and the initial light emitting luminance is high, the concentration of the dopant moved to the light emitting layer measured after the electrification test is not less than $2\times10^{16}$ cm$^{-3}$. Herein, the light emitting luminance is remarkably decreased in accordance with the increase in the concentration of the dopant moved to the light emitting layer 42 after the reliability test.

The penetration of the dopant due to the thermal history in the epitaxial growth and the electrification is remarkable for the p-type dopant such as Zn, Mg or the like compared with the n-type dopant such as Si, Se, Te or the like. For example, in the case where the upper cladding layer 43, the intermediate layer 5, and the current-spreading layer 6 are p-type crystal layers, the penetration of the p-type dopant to the light emitting layer 42 can be substantially suppressed by providing the concentrations of the hydrogen, carbon and oxygen in each of the upper cladding layer 43, the intermediate layer 5, and the current-spreading layer 6 to be within the aforementioned concentration ranges (each of which is lower than the predetermined value). When the impurity element concentration of either one of the hydrogen, carbon and oxygen exceeds the aforementioned concentration, the concentration of the dopant moved to the light emitting layer measured after the epitaxial growth or after the electrification test is not less than $2\times10^{16}$ cm$^{-3}$.

In the intermediate layer 5, the concentration of p-type dopant is higher than that in the other crystal layers. However, even if the concentrations of the hydrogen, carbon and oxygen are increased compared with those in the other crystal layers, the effect on the amount of the p-type dopant moved to the light emitting layer 42 will be small. The reason of this effect is assumed that a thickness of the intermediate layer 5 is smaller than that of the other crystal layers, namely, not more than 1/10 thereof.

As for the n-type dopant, similarly to the p-type dopant, the light emitting luminance falls when the concentration of the dopant moved to the light emitting layer 42 is not less than $2 \times 10^{16}$ cm$^{-3}$. However, by controlling the concentrations of the hydrogen, carbon and oxygen in the lower cladding layer 41 within the predetermined concentration ranges as described above, it is possible to suppress the concentration of the dopant moved to the light emitting layer 42 measured after the epitaxial growth or after the electrification test to be lower than $2 \times 10^{16}$ cm$^{-3}$.

When the upper cladding layer 43, the intermediate layer 5, the current-spreading layer 6 are n-type crystal layers, and the lower cladding layer 41 is a p-type crystal layer, it is preferable to control the concentrations of the hydrogen, carbon and oxygen in these layers and the light emitting layer within the predetermined concentration ranges as described above, so as to prevent the light emitting luminance from falling in the long term electrification of the light emitting diode 10.

(Voltage Loss in the Intermediate Layer)

Next, a decrease of the voltage loss in the intermediate layer during the electrification to the light emitting diode will be explained below.

Figure 2:
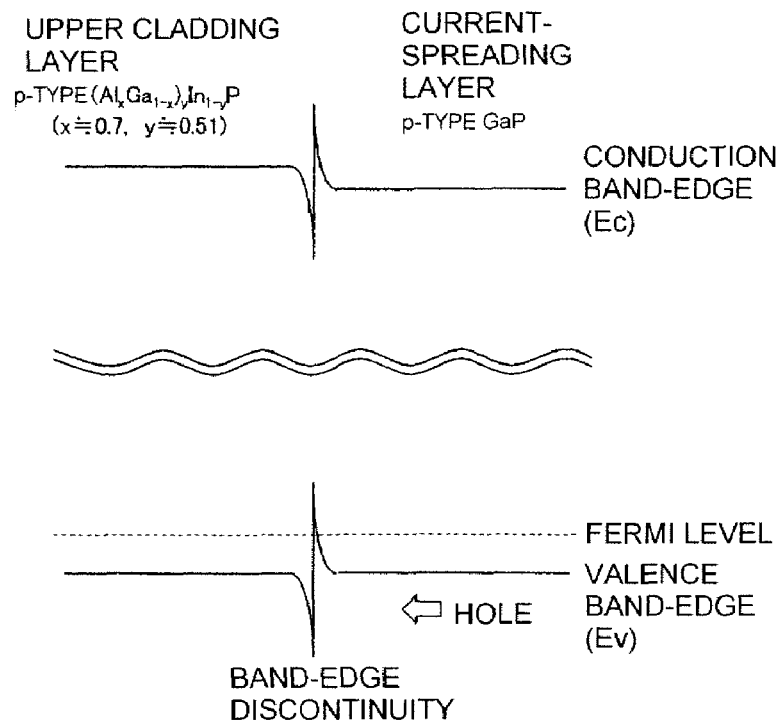
FIG. 2 is an explanatory diagram showing a band configuration in vicinity of a junction of a cladding layer and a current-spreading layer.
Figure 3:
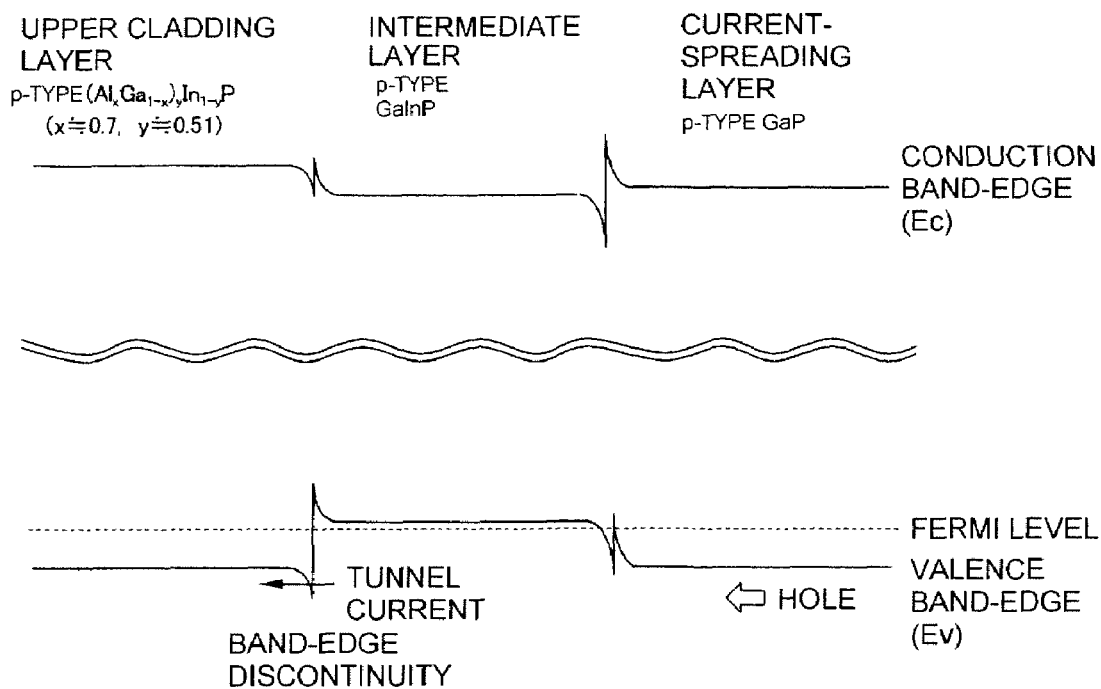
FIG. 3 is an explanatory diagram showing a band configuration in vicinity of a junction of the cladding layer, the current-spreading layer and an intermediate layer.

FIG. 2 is an explanatory diagram showing a band configuration in vicinity of a junction of the cladding layer and the current-spreading layer, and FIG. 3 is an explanatory diagram showing a band configuration in vicinity of a junction of the cladding layer, the current-spreading layer and the intermediate layer.

Fundamentally speaking, the main object for providing the intermediate layer 5 is to reduce a barrier against the electron or hole in the band-edge discontinuity occurred at an interface between the upper cladding layer 43 and the current-spreading layer 6. FIG. 2 schematically shows an example of a band configuration in vicinity of the junction of a p-type $(Al_xGa_{1-x})_yIn_{1-y}P$ (x≈0.7, y≈0.51) upper cladding layer 43 and a p-type GaP current-spreading layer 6. Since an electron affinity of AlGaInP is different from that of GaP, the band-edge discontinuities occur in both a conduction band-edge (Ec) and a valence band-edge (Ev) at the junction interface. It is assumed that a carrier of an electric current flowing through the p-type AlGaInP upper cladding layer 43 and the p-type GaP current-spreading layer 6 during the electrification to the light emitting diode 10 is mainly the hole. Therefore, it is contemplated that the discontinuity of the valence band-edge (Ev) functions as the barrier against the hole so that a large voltage loss occurs.

Figure 6:
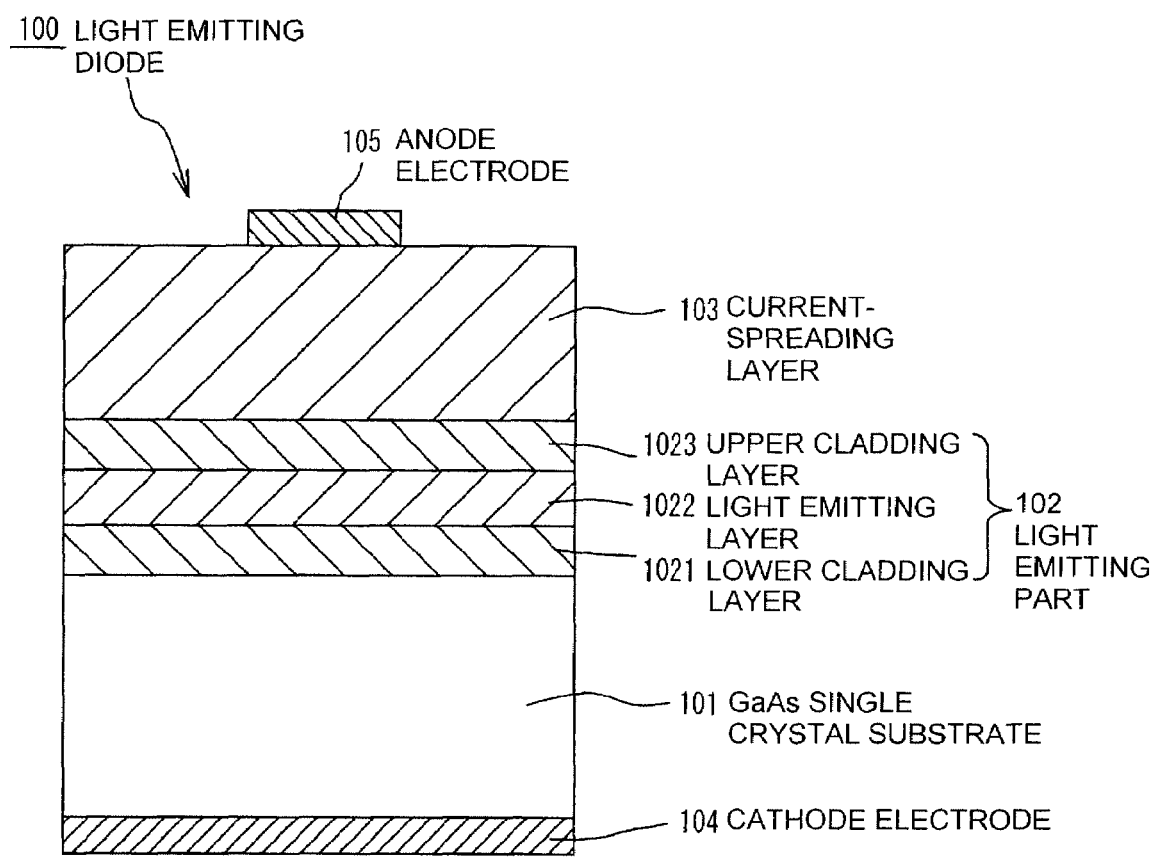
FIG. 6 is a schematic cross sectional view of a conventional light emitting diode.

In addition, when the light emitting diode 100 shown in FIG. 6 is operated to emit the light at a current density of about 22.2 A/cm$^2$, not less than 2.5V was measured that is a high value as the forward voltage. In addition, since a composition of the AlGaInP upper cladding layer 1023 is controlled to substantially lattice-match with GaAs, there is about 4% of lattice mismatch between the GaP current-spreading layer 103 and the AlGaInP upper cladding layer 1023. Therefore, there is a disadvantage in that a yield of the electrode forming process is deteriorated, since a large irregularity (unevenness) occurs at a surface of the GaP current-spreading layer 103.

FIG. 3 schematically shows an example of a band configuration in vicinity of the junction of the upper cladding layer 43, the intermediate layer 5, and the current-spreading layer 6, in that the intermediate layer 5 is formed between the upper cladding layer 43 and the current-spreading layer 6. FIG. 3 shows an example using, as the intermediate layer 5, a p-type $(Al_xGa_{1-x})_yIn_{1-y}P$ (x≈0, y≈0.7) layer doped with a p-type dopant to have a high carrier concentration of not less than $3 \times 10^{18}$ cm$^{-3}$, namely a p-type GaInP layer with a high carrier concentration in which a GaP mixed crystal ratio is about 0.7. The GaInP layer is shown in a degenerated state since the GaInP layer is doped with the p-type dopant at a high concentration. By forming the GaInP intermediate layer 5, the discontinuity of the valence band-edge (Ev) is relaxed, so that the barrier against the hole is lowered. In addition, when the aforementioned GaInP intermediate layer was further provided in the conventional light emitting diode shown in FIG. 6, the forward voltage was about 2.2V at a current density of about 22.2 A/cm$^2$. Further, a remarkable irregularity (unevenness) was not observed at the surface of the GaP current-spreading layer 103, and a surface quality was good.

As described above, the first factor for reducing the forward voltage of the light emitting diode 10 by providing the intermediate layer 5 is assumed as follows. The provision of the intermediate layer 5 lowers the barrier against the hole generated by the discontinuity of the valence band-edge (Ev). In addition, two additional factors are proposed.

The first one of the two additional factors is an effect obtained by increasing the dopant concentration of the intermediate layer 5. Since the concentration of the p-type dopant in the intermediate layer 5 is increased, the barrier against the hole at the interface between the intermediate layer 5 and the current-spreading layer 6 is extremely lowered. In addition, while there exists a relatively high barrier at the interface between the upper cladding layer 43 and the intermediate layer 5, a hole concentration of the intermediate layer 5 is extremely high, so that the tunnel current flowing through the barrier is increased. The effect of reducing the forward voltage obtained by the increase in the tunnel current is remarkable when the p-type dopant concentration of the intermediate layer 5 is elevated to $3 \times 10^{18}$ cm$^{-3}$. As a result, the forward voltage is reduced to about 2.2V as described above. However, when the p-type dopant concentration of the intermediate layer 5 is further increased, it is observed that the forward voltage tends to slightly decrease. Further, when the p-type dopant concentration of the intermediate layer 5 is increased to $1 \times 10^{19}$ cm$^{-3}$, the surface quality of the current-spreading layer 6 is deteriorated and the yield of the light emitting diode 10 is decreased.

The second one of the two additional factors is an influence of an interface state. The intermediate layer 5 provides the effect of relaxing the lattice mismatch between the upper cladding layer 43 and the current-spreading layer 6, and a great improvement in the surface quality of the current-spreading layer 6 by forming the intermediate layer 5 is observed as described above. This improvement effect is obtained when the GaP mixed crystal ratio of the GaInP intermediate layer 5 is within a range of 0.6 to 0.9, in other words, when the lattice constant of GaInP is a value between a lattice constant of AlGaInP upper cladding layer 43 and a lattice constant of the GaP current-spreading layer 6. The GaInP intermediate layer 5 having the GaP mixed crystal ratio within the range of 0.6 to 0.9 is lattice-mismatching with the upper cladding layer 43 and the current-spreading layer 6, respectively. Therefore, it is assumed that the crystal defects due to the lattice mismatch are generated with a high density at the interface. In addition, it is assumed that the crystal defect at the interface is increased by providing the intermediate layer 5 with the high dopant concentration. It is contemplated that the crystal defect at the interface forms the interface state in the band gap. It is also conceivable that an increase in a current generated by the hole penetration through the interface state (hereinafter referred as "interface leak current") contributes to the decrease in the forward voltage.

Aiming at a further reduction of the forward voltage, the p-type GaInP intermediate layer 5 is intentionally doped with the n-type dopant, and the decrease in the forward voltage is observed. Under the condition that the p-type dopant concentration is not less than $3\times10^{18}$ cm$^{-3}$ and the GaP mixed crystal ratio of the intermediate layer 5 is within the range of 0.6 to 0.9, the effect of reducing the forward voltage appears when the concentration of the n-type dopant exceeds $1\times10^{17}$ cm$^{-3}$. The effect of reducing the forward voltage is remarkable when the concentration of the n-type dopant is not less than $5\times10^{17}$ cm$^{-3}$. For example, in the case of applying the GaInP intermediate layer 5 having the p-type dopant concentration of $3\times10^{18}$ cm$^{-3}$, the n-type dopant concentration of $5\times10^{17}$ cm$^{-3}$, and the GaP mixed crystal ratio of about 0.7, the forward voltage of the light emitting diode is not more than 2.0V at a current density of about 22.2 A/cm$^2$. It is assumed that this effect is obtained since the interface state density is significantly increased by doping the n-type dopant in addition to the p-type dopant, so that the interface leak current is increased. When the n-type dopant concentration in the intermediate layer 5 is further increased, it is observed that the forward voltage tends to slightly decrease. However, when the n-type dopant concentration is not less than 50% of the p-type dopant concentration, the forward voltage tends to increase in reverse. It is assumed that compensation for acceptors by donors progresses so that the tunnel current at the interface is reduced.

In the GaInP intermediate layer 5, when the GaP mixed crystal ratio is within the range of 0.6 to 0.9 and the p-type dopant concentration is within the range of $3\times10^{18}$ cm$^{-3}$ to $9\times10^{18}$ cm$^{-3}$, even if the GaInP intermediate layer 5 is doped with the n-type dopant at a concentration of about 50% of the p-type dopant concentration, the surface quality of the GaP current-spreading layer 6 formed on the GaInP intermediate layer 5 is good. In addition, when the concentrations of the hydrogen, carbon and oxygen in the lower cladding layer 41, the light emitting layer 42, the upper cladding layer 43, the intermediate layer 5 and the current-spreading layer 6 are within the predetermined concentration ranges as described above, the concentrations of the dopant moved to the light emitting layer 42 after the epitaxial growth and after the electrification test are lower than $2\times10^{16}$ cm$^{-3}$.

(Effect of the First Preferred Embodiment)

According to the first preferred embodiment, by respectively defining the concentrations of the hydrogen, carbon and oxygen in the lower cladding layer 41, the light emitting layer 42, the upper cladding layer 43, the intermediate layer 5 and the current-spreading layer 6, it is possible to provide a light emitting diode with high reliability in which the fall of the light output due to the reliability test is significantly small. On the other hand, in the conventional and ordinary AlGaInP based light emitting diode, the light output is reduced by around 30% with respect to the initial value, so that high reliability cannot be obtained.

In the first preferred embodiment, Mg is used as the p-type dopant, however the present invention is not limited thereto, and Zn may be also used as the p-type dopant. In addition, Te is used as the n-type dopant, however the present invention is not limited thereto, and Se or Si may be also used as the n-type dopant.

In addition, it is possible to provide the intermediate layer 5 containing one or more elements selected from a group consisting of Si, Se, and Te, in which a total impurity concentration is $5\times10^{17}$ cm$^{-3}$ and lower than the Mg concentration.

Further, in the first preferred embodiment, the conductivity type of the GaAs substrate 1, the buffer layer 2, the Bragg reflection layer 3 and the lower cladding layer 41 are n-type, and the conductivity type of the upper cladding layer 43, the intermediate layer 5 and the current-spreading layer 6 is p-type, however the present invention is not limited thereto, and the conductivity type of these crystal layers are interchangeable with each other. In that case, similarly to the light emitting part 4, it is preferable that the concentration of the hydrogen is not more than $2\times10^{17}$ cm$^{-3}$, the concentration of the carbon is not more than $2\times10^{16}$ cm$^{-3}$, and the concentration of the oxygen is not more than $2\times10^{16}$ cm$^{-3}$ in the p-type AlGaInP layer composing the Bragg reflection layer 3.

EXAMPLE 1

Next, examples of the present invention will be explained below.

In Example 1, the respective layers of the light emitting diode 10 of FIG. 1 are constituted as follows.

In a Bragg reflection layer 3, a single layer of n-type $(Al_xGa_{1-x})_yIn_{1-y}P$ ($x\approx1$, $y\approx0.51$, and a dopant is Te in this example) and a single layer of n-type $Al_xGa_{1-x}As$ ($x\approx0.5$, a dopant is Te in this example) are laminated to provide a pair of two crystal layers. 20 pairs thereof are formed to compose the Bragg reflection layer 3.

A light emitting part 4 comprises an n-type lower cladding layer 41, an n-type light emitting layer 42, and a p-type upper cladding layer 43.

The lower cladding layer 41 comprises an n-type $(Al_xGa_{1-x})_yIn_{1-y}P$ ($x\approx0.7$, $y\approx0.51$, and a dopant is Te in this example) with a dopant concentration of about $4\times10^{17}$ cm$^{-3}$ and a thickness of about 0.5 µm.

The light emitting layer 42 has a multiquantum well structure comprising $(Al_xGa_{1-x})_yIn_{1-y}P$. In this example, $(Al_xGa_{1-x})_yIn_{1-y}P$ ($x\approx0.5$, $y\approx0.51$ in this example) and $(Al_xGa_{1-x})_yIn_{1-y}P$ ($x\approx0$, $y\approx0.51$ in this example) are used as the light emitting layer 42, and a peak wave length of a light emitting energy spectrum of the light emitting diode 10 is about 635 nm. This light emitting layer 42 is grown without doping (i.e. undoped).

The upper cladding layer 43 comprises a p-type $(Al_xGa_{1-x})_yIn_{1-y}P$ ($x\approx0.7$, $y\approx0.51$, and a dopant is Mg) with a dopant concentration of about $1\times10^{17}$ cm$^{-3}$ and a thickness of about 1 µm.

The intermediate layer 5 comprises a p-type $(Al_xGa_{1-x})_yIn_{1-y}P$ ($x\approx0$, $y\approx0.7$, and dopants are Mg and Te) with a Mg (p-type dopant) concentration of about $5\times10^{18}$ cm$^{-3}$, a Te concentration of about $5\times10^{17}$ cm$^{-3}$, and a thickness of about 20 nm.

In Example 1, the current-spreading layer 6 comprises a Mg-doped p-type GaP with a thickness of about 12 µm. The p-type dopant concentration is about $4.5\times10^{18}$ cm$^{-3}$.

In Example 1, a cathode electrode 7 comprises AuGe alloy, Ni, and Au that are deposited by a vacuum deposition in order of AuGe alloy→Ni→Au.

An anode electrode 8 comprises AuZn alloy, Ni, and Au that are laminated in order of AuZn alloy→Ni→Au, and shaped by a lift-off method using a photoresist pattern to provide an electrode with predetermined shape and size.

After forming the cathode electrode 7 and the anode electrode 8, the heat treatment is conducted such that a contact between each electrode and each crystal layer shows ohm characteristics. An epitaxial wafer on which the electrodes are formed is diced to provide a light emitting diode chip having a surface size of about 300 μm×300 μm, and a light emitting diode chip having a surface size of about 1 mm×1 mm, respectively. After mounting each of the light emitting diodes on a metal stem, the measurement of a light output and a forward voltage and the reliability test were carried out.

In Example 1 according to the aforementioned structure, for each crystal layer (epitaxial layer) constituting the light emitting diode 10, the conditions such as epitaxial growth temperature, V/III ratio and the like are examined, and the condition to control the concentrations of the hydrogen, carbon and oxygen in each crystal layer was established. The concentrations of the hydrogen, carbon and oxygen of the lower cladding layer 41, the light emitting layer 42, the upper cladding layer 43, the intermediate layer 5 and the current-spreading layer 6 were measured concerning the epitaxial wafer for a light emitting diode grown under the control conditions established above. The measuring results are shown in TABLE 1. Herein, it was confirmed that the concentrations of the hydrogen, carbon and oxygen are approximately the same in the lower cladding layer 41, the light emitting layer 42, and the upper cladding layer 43, when the growth temperature, the V/III ratio and the like are in the same conditions. Therefore, these crystal layers in total are expressed as a light emitting part.

TABLE 1

| Crystal layer | Concentration of hydrogen (cm$^{-3}$) | Concentration of carbon (cm$^{-3}$) | Concentration of oxygen (cm$^{-3}$) |
| --- | --- | --- | --- |
| Light emitting part | $1.2 \times 10^{17}$ | $1.1 \times 10^{16}$ | $1 \times 10^{16}$ or less |
| Current-spreading layer | $1.3 \times 10^{17}$ | $7.8 \times 10^{16}$ | $1 \times 10^{16}$ or less |
| Intermediate layer | $4.1 \times 10^{17}$ | $3.3 \times 10^{17}$ | $1.2 \times 10^{16}$ |

The measured values shown in TABLE 1 are calibrated values based on normal samples, and the hydrogen, carbon and oxygen concentrations were measured by a SIMS (Secondary Ion Mass Spectrometry). Detection limit concentrations of respective elements were $1 \times 10^{17}$ cm$^{-3}$ for the hydrogen, $1 \times 10^{16}$ cm$^{-3}$ for the carbon and $1 \times 10^{16}$ cm$^{-3}$ for the oxygen, respectively.

The measurement of the light output and the forward voltage were carried out under the conditions of a current density of about 22.2 A/cm$^2$ and an ambient temperature of 25° C. In the light emitting diode of Example 1, a light output of about 2.5 mW and a forward voltage of about 1.90V that are considered as good values were provided.

The reliability test was conducted under the condition of a current density of about 44.4 A/cm$^2$ and electrification for 2000 hours in an environment of an ambient temperature of 85° C. and a humidity of 85%. In the light emitting diode 10 of Example 1, the alteration in the light output and the forward voltage was not observed after the reliability test.

The dopant concentration of the light emitting layer 42 in the epitaxial wafer for a light emitting diode and in the light emitting diode after the reliability test was measured by the SIMS method. The dopant concentration of the light emitting layer 42 was not more than $1 \times 10^{16}$ cm$^{-3}$ for both cases. The detection limit concentrations of the dopants by SIMS method are $8 \times 10^{15}$ cm$^{-3}$ for Mg and $1 \times 10^{15}$ cm$^{-3}$ for Te, respectively.

In Example 1, it is possible to provide the light emitting diode 10 with a high light output in which the fall of the light emitting is little even after the reliability test, by controlling the concentrations of the hydrogen, carbon and oxygen in the light emitting part 4 (the lower cladding layer 41, the light emitting layer 42, and the upper cladding layer 43), the intermediate layer 5 and the current-spreading layer 6 to have the values shown in TABLE 1.

Experimental samples of light emitting diodes shown in TABLES 2 to 4 were manufactured to examine the influences of the concentrations of the hydrogen, carbon and oxygen in the crystal layer on characteristics of the light emitting diode. The configuration of the experimental sample is based on the configuration shown in FIG. 1. In the experimental samples, the concentrations of the hydrogen, carbon and oxygen in the light emitting part 4, the intermediate layer 5, and the current-spreading layer 6 were varied.

TABLE 2

| Sample No. | Concentration of hydrogen (cm$^{-3}$) | Concentration of carbon (cm$^{-3}$) | Concentration of oxygen (cm$^{-3}$) |
| --- | --- | --- | --- |
| #11 | $2.2 \times 10^{17}$ | $1.2 \times 10^{16}$ | $1 \times 10^{16}$ or less |
| #12 | $1.1 \times 10^{17}$ | $2.2 \times 10^{16}$ | $1.1 \times 10^{16}$ |
| #13 | $1.2 \times 10^{17}$ | $1.1 \times 10^{16}$ | $2.3 \times 10^{16}$ |

TABLE 3

| Sample No. | Concentration of hydrogen (cm$^{-3}$) | Concentration of carbon (cm$^{-3}$) | Concentration of oxygen (cm$^{-3}$) |
| --- | --- | --- | --- |
| #21 | $3.1 \times 10^{17}$ | $7.2 \times 10^{16}$ | $1 \times 10^{16}$ or less |
| #22 | $6.0 \times 10^{17}$ | $7.6 \times 10^{16}$ | $1 \times 10^{16}$ or less |
| #23 | $1.2 \times 10^{17}$ | $2.5 \times 10^{17}$ | $1.1 \times 10^{16}$ |
| #24 | $1.2 \times 10^{17}$ | $7.1 \times 10^{17}$ | $1.2 \times 10^{16}$ |
| #25 | $1.1 \times 10^{17}$ | $7.4 \times 10^{16}$ | $1.8 \times 10^{16}$ |
| #26 | $1.2 \times 10^{17}$ | $7.3 \times 10^{16}$ | $3.2 \times 10^{16}$ |

TABLE 4

| Sample No. | Concentration of hydrogen (cm$^{-3}$) | Concentration of carbon (cm$^{-3}$) | Concentration of oxygen (cm$^{-3}$) |
| --- | --- | --- | --- |
| #31 | $8.2 \times 10^{17}$ | $3.1 \times 10^{17}$ | $1.2 \times 10^{16}$ |
| #32 | $1.1 \times 10^{18}$ | $3.5 \times 10^{17}$ | $1.1 \times 10^{16}$ |
| #33 | $4.8 \times 10^{17}$ | $7.0 \times 10^{17}$ | $2.4 \times 10^{16}$ |
| #34 | $4.3 \times 10^{17}$ | $1.2 \times 10^{18}$ | $3.1 \times 10^{16}$ |
| #35 | $4.4 \times 10^{17}$ | $3.6 \times 10^{17}$ | $3.2 \times 10^{16}$ |
| #36 | $4.7 \times 10^{17}$ | $3.4 \times 10^{17}$ | $6.2 \times 10^{16}$ |

In the samples shown in TABLE 2, the concentrations of the hydrogen, carbon and oxygen of the light emitting part 4 are varied.

In the sample #11, the hydrogen concentration is increased by 2 times of that in Example 1. The concentrations of the carbon and the oxygen are approximately the same as those in Example 1. In addition, the epitaxial growth condition of the crystal layers except the light emitting part 4 is the same as that in Example 1.

Similarly, in the sample #12, the carbon concentration is increased by 2 times of that in Example 1.

In Sample #13, the oxygen concentration is increased to $2.3 \times 10^{16}$ cm$^{-3}$.

The hydrogen concentration of the crystal layer is varied mainly by controlling the growth temperature. The carbon concentration is varied mainly by controlling the V/III ratio. The V/III ratio also influences the oxygen concentration. However, the effect on the oxygen concentration was smaller than the effect on the carbon concentration. The oxygen concentration was varied by intentionally doping the oxygen in the epitaxial growth. The effect of intentionally doping the oxygen on the concentrations of the hydrogen and carbon was not observed.

In the method similar to those used for the samples shown in TABLE 2, the concentrations of the hydrogen, carbon and oxygen of the intermediate layer 5 and the current-spreading layer 6 were varied.

TABLE 3 shows samples in which the concentrations of the hydrogen, carbon and oxygen in the current-spreading layer 6 are respectively varied, and TABLE 4 shows samples in which the concentrations of the hydrogen, carbon and oxygen in the intermediate layer 5 are respectively varied.

For the experimental samples of the light emitting diode 10 shown in TABLES 2 to 4, the light output was measured and the reliability test was carried out. TABLE 5 shows initial values of the light output and relative values of the light output after conducting the reliability test. The relative value in TABLE 5 is a value in the case where the initial value of the light output is 1.

TABLE 5

| Sample No. | Light output | |
|---|---|---|
| | Initial value (mW) | Relative value after the reliability test |
| Example 1 (for reference) | 2.54 | 1.00 |
| #11 | 2.49 | 0.80 |
| #12 | 2.41 | 0.79 |
| #13 | 2.01 | 0.79 |
| #21 | 2.52 | 0.89 |
| #22 | 2.49 | 0.79 |
| #23 | 2.51 | 0.86 |
| #24 | 2.44 | 0.76 |
| #25 | 2.52 | 0.88 |
| #26 | 2.48 | 0.78 |
| #31 | 2.52 | 0.91 |
| #32 | 2.40 | 0.78 |
| #33 | 2.51 | 0.90 |
| #34 | 2.36 | 0.77 |
| #35 | 2.51 | 0.92 |
| #36 | 2.39 | 0.79 |

At first, the samples #11 to 13 in which the concentrations of the hydrogen, carbon, and oxygen (O) of the light emitting part 4 are varied will be explained.

In the sample #11 in which the hydrogen concentration of the light emitting part 4 is increased to $2.2 \times 10^{17}$ cm$^{-3}$ and the sample #12 in which the carbon concentration of the light emitting part 4 is increased to $2.2 \times 10^{16}$ cm$^{-3}$, the initial values of the light output were comparatively good. However, a large fall was observed in the light output after the reliability test, and the light output after the reliability test was reduced by 20% or more as compared with the initial value.

In the sample #13 in which the oxygen concentration of the light emitting part 4 is increased to $2.3 \times 10^{16}$ cm$^{-3}$, the initial value was reduced by 20% or more compared with the light emitting diode 10 in Example 1. The light output after the reliability test was reduced by 20% or more as compared with the initial value.

The Mg dopant concentrations of the light emitting layer 42 in the experimental samples #11 to 13 were measured by the SIMS method. The dopant concentrations before and after the reliability test were $1.2 \times 10^{16}$ cm$^{-3}$ and $2.1 \times 10^{16}$ cm$^{-3}$ in the sample #11, $1.4 \times 10^{16}$ cm$^{-3}$ and $2.2 \times 10^{16}$ cm$^{-3}$ in the sample #12, $2.0 \times 10^{16}$ cm$^{-3}$ and $3.2 \times 10^{16}$ cm$^{-3}$ in the sample #13, respectively. Since the measurement result of the Mg dopant concentration of the light emitting diode 10 in Example 1 is not more than $1 \times 10^{16}$ cm$^{-3}$, it is assumed that the dopant measured in the light emitting layer 42 of the experimental samples #11 to #13 have moved from the crystal layers other than the light emitting layer 42 during the epitaxial growth or the reliability test. In addition, it is conceivable that the penetration of the dopant is strongly affected by the concentrations of the hydrogen, carbon and oxygen in the light emitting part 4, and that the dopant moved to the light emitting layer 42 causes the fall of the light output.

From the results of the experimental samples #11 to #13, it is preferable that the hydrogen concentration is not more than $2 \times 10^{17}$ cm$^{-3}$, the carbon concentration is not more than $2 \times 10^{16}$ cm$^{-3}$, and the oxygen concentration is not more than $2 \times 10^{16}$ cm$^{-3}$, respectively in the light emitting part 4 (the lower cladding layer 41, the light emitting layer 42, and the upper cladding layer 43) to suppress a large fall (fall of 20% or more) of the initial value of the light output and the light output after the reliability test.

Next, the samples #21 to #26 in which the concentrations of the hydrogen, carbon, and oxygen of the current-spreading layer 6 are varied will be explained. The initial values were good for all samples.

However, in the sample #22 in which the hydrogen concentration of the current-spreading layer 6 is increased to $6.0 \times 10^{17}$ cm$^{-3}$, the sample #24 in which the carbon concentration of the current-spreading layer 6 is increased to $7.1 \times 10^{17}$ cm$^{-3}$, and the sample #26 in which the oxygen concentration of the current-spreading layer 6 is increased to $3.2 \times 10^{16}$ cm$^{-3}$, a large fall was observed in the light output after the reliability test, and the light output after the reliability test was reduced by 20% or more as compared with the initial value. The dopant concentrations of the light emitting layer of these samples after the reliability test were within a range of $2.2 \times 10^{16}$ cm$^{-3}$ to $2.4 \times 10^{16}$ cm$^{-3}$, namely not less than $2.0 \times 10^{16}$ cm$^{-3}$ that is considered as a high value in all of these samples.

On the other hand, in the sample #21 in which the hydrogen concentration of the current-spreading layer 6 is $3.1 \times 10^{17}$ cm$^{-3}$, the sample #23 in which the carbon concentration of the current-spreading layer 6 is $2.5 \times 10^{17}$ cm$^{-3}$, and the sample #25 in which the oxygen concentration of the current-spreading layer 6 is $1.8 \times 10^{16}$ cm$^{-3}$, the fall of the light output after the reliability test was 11% to 14% that is relatively small. The dopant concentrations of the light emitting layer of these samples after the reliability test were within a range of $1.7 \times 10^{16}$ cm$^{-3}$ to $1 \times 10^{16}$ cm$^{-3}$, namely not more than $2.0 \times 10^{16}$ cm$^{-3}$ in all of these samples.

From the results of the experimental samples #21 to #26, it is assumed that the influence of the dopant moved to the light emitting layer 42 is a cause of the fall of the light output and it is confirmed that the penetration of the dopant is strongly affected by the concentrations of the hydrogen, carbon and oxygen in the current-spreading layer 6. It is preferable that the hydrogen concentration is not more than $5 \times 10^{17}$ cm$^{-3}$, the carbon concentration is not more than $5 \times 10^{17}$ cm$^{-3}$, and the oxygen concentration is not more than $2 \times 10^{16}$ cm$^{-3}$, respectively in the current-spreading layer 6 to suppress a large fall (fall of 20% or more) of the light output after the reliability test.

Next, the samples #31 to #36 in which the concentrations of the hydrogen, carbon, and oxygen of the intermediate layer 5 are varied will be explained. The initial values were good for all samples, similarly to the samples #21 to #26 in which the concentrations of the hydrogen, carbon, and oxygen of the current-spreading layer 6 are varied.

However, in the sample #32 in which the hydrogen concentration of the intermediate layer 5 is $1.1 \times 10^{18}$ cm$^{-3}$, the sample #34 in which the carbon concentration of the intermediate layer 5 is $1.2\times10^{18}$ cm$^{-3}$, and the sample #36 in which the oxygen concentration of the intermediate layer 5 is $6.2\times10^{16}$ cm$^{-3}$, a large fall was observed in the light output after the reliability test, and the light output after the reliability test was reduced by 20% or more as compared with the initial value. The dopant concentrations of the light emitting layer 42 of these samples after the reliability test were within a range of $2.1\times10^{16}$ cm$^{-3}$ to $2.2\times10^{16}$ cm$^{-3}$ that is considered as a high value in all of these samples.

On the other hand, in the sample #31 in which the hydrogen concentration of the intermediate layer 5 is $8.2\times10^{17}$ cm$^{-3}$, the sample #33 in which the carbon concentration of the intermediate layer 5 is $7.0\times10^{17}$ cm$^{-3}$, and the sample #35 in which the oxygen concentration of the intermediate layer 5 is $3.2\times10^{16}$ cm$^{-3}$, the fall of the light output after the reliability test was 8% to 10% that is relatively small. The dopant concentrations of the light emitting layer of these samples after the reliability test were within a range of $1.6\times10^{16}$ cm$^{-3}$ to $1.8\times10^{16}$ cm$^{-3}$.

From the results of the experimental samples #31 to #36, it is assumed that the influence of the dopant moved to the light emitting layer 42 is a cause of the fall of the light output and it is confirmed that the penetration of the dopant is strongly affected by the concentrations of the hydrogen, carbon and oxygen in the intermediate layer 5. It is preferable that the hydrogen concentration is not more than $1\times10^{18}$ cm$^{-3}$, the carbon concentration is not more than $1\times10^{18}$ cm$^{-3}$, and the oxygen concentration is not more than $5\times10^{16}$ cm$^{-3}$, respectively in the intermediate layer 5 to suppress a large fall of the light output after the reliability test.

In the light emitting diode 10 of Example 1, a forward voltage of about 1.90V that is a good value was obtained. It is assumed that this is an effect of intentionally doping the n-type dopant (Te in Example 1) to the intermediate layer 5. The forward voltage of the light emitting diode in which the intermediate layer 5 is doped with only the p-type dopant (Mg in Example 1) was about 2.11V that is considered as a high value. In the case where the p-type dopant concentration is within a range of $3\times10^{18}$ cm$^{-3}$ to $9\times10^{18}$ cm$^{-3}$ and the n-type dopant concentration is $5\times10^{17}$ cm$^{-3}$ in the intermediate layer 5, the forward voltage of the light emitting diode 10 is about 1.90V. In addition, even if the n-type dopant is increased to be about 50% of the p-type dopant, no remarkable alteration was observed in the forward voltage. When the n-type dopant concentration is increased to be 50% or more of the p-type dopant concentration, or when the n-type dopant concentration is decreased to be $4\times10^{17}$ cm$^{-3}$ or less, it is observed that the forward voltage of the light emitting diode is remarkably increased for both cases.

EXAMPLE 2

Next, Example 2 will be explained below. The same effect as that in Example 1 was obtained by controlling the concentrations of the hydrogen, carbon and oxygen to have values shown in TABLE 1 only in a partial region of the current-spreading layer 6 of Example 1. It is preferable that this region has a predetermined thickness from an interface with the intermediate layer 5 that is greater than 20% of a thickness of the current-spreading layer 6. However, when the thickness of the current-spreading layer 6 is reduced, the thickness of the partial region of the current-spreading layer 6 can be reduced approximately in proportion to the thickness of the current-spreading layer 6.

In order to suppress the carbon concentration and the oxygen concentration in the crystal layer, it is necessary to conduct the epitaxial growth with increasing a supply of the V group source and the V/III ratio. For growing a relatively thick layer such as the current-spreading layer 6, it is possible to reduce the manufacturing cost of the light emitting diode 10 by decreasing a thickness of the region grown with a high V/III ratio.

In Example 2, it is possible to further reduce the thickness of the aforementioned region by decreasing the dopant concentration of this region or by varying the dopant concentration.

Second Preferred Embodiment

Figure 4:
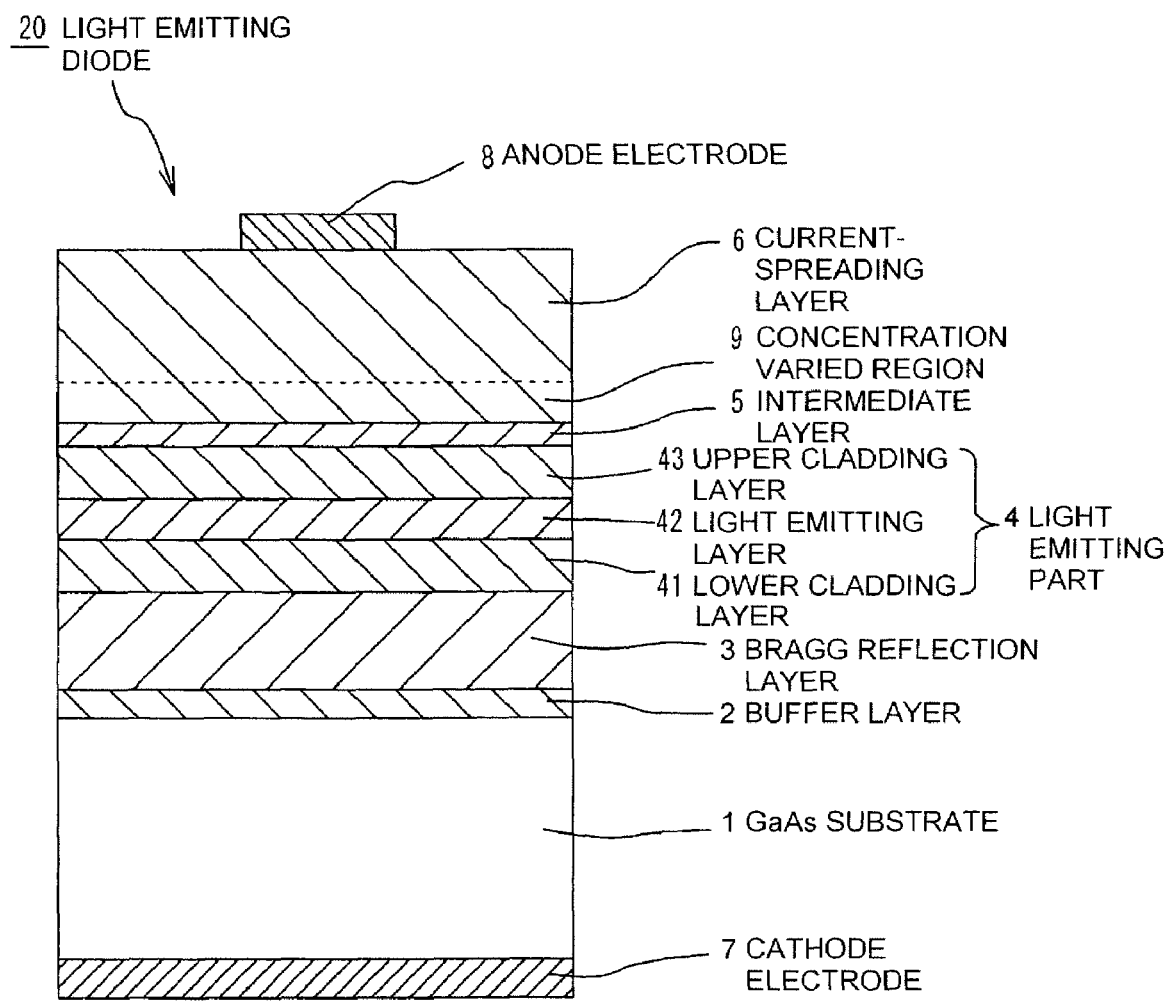
FIG. 4 is a schematic cross sectional view of a light emitting diode in a second preferred embodiment according to the present invention.

FIG. 4 is a schematic cross sectional view of a light emitting diode in the second preferred embodiment according to the present invention.

A light emitting diode 20 in the second preferred embodiment is similar to the light emitting diode 10 in the first preferred embodiment, except that a dopant (Mg) concentration varied region 9 is provided in the current-spreading layer 6 in the first preferred embodiment.

The dopant concentration of the concentration varied region 9 is not more than $6\times10^{17}$ cm$^{-3}$ in vicinity of an interface with the intermediate layer 5 The dopant concentration is gradually increased up to $4.5\times10^{18}$ cm$^{-3}$ in a thickness direction. The concentrations of the hydrogen, carbon and oxygen in the concentration varied region 9 are controlled to have the values of the current-spreading layer shown in TABLE 1.

Other region of the current-spreading layer 6 than the concentration varied region 9 is grown under the condition that the hydrogen concentration is about $6.0\times10^{17}$ cm$^{-3}$, the carbon concentration is about $2.5\times10^{17}$ cm$^{-3}$, and the oxygen concentration is about $1.1\times10^{16}$ cm$^{-3}$. Even if a thickness of the concentration varied region 9 is reduced to 1.5 μm, the light output is approximately the same as that in the first preferred embodiment before and after the reliability test. When the thickness of the concentration varied region 9 is smaller than 1.5 μm, or the dopant concentration in vicinity of the interface with the intermediate layer 5 is higher than $6.0\times10^{17}$ cm$^{-3}$, the light output after the reliability test is decreased.

In the case where the dopant concentration of the concentration varied region 9 is reduced approximately uniformly, the light output approximately the same as that in the first preferred embodiment before and after the reliability test can be obtained if the dopant concentration is not more than $1\times10^{17}$ cm$^{-3}$, even though the thickness of the concentration varied region 9 is reduced to 1.5 μm.

Third Preferred Embodiment

Figure 5:
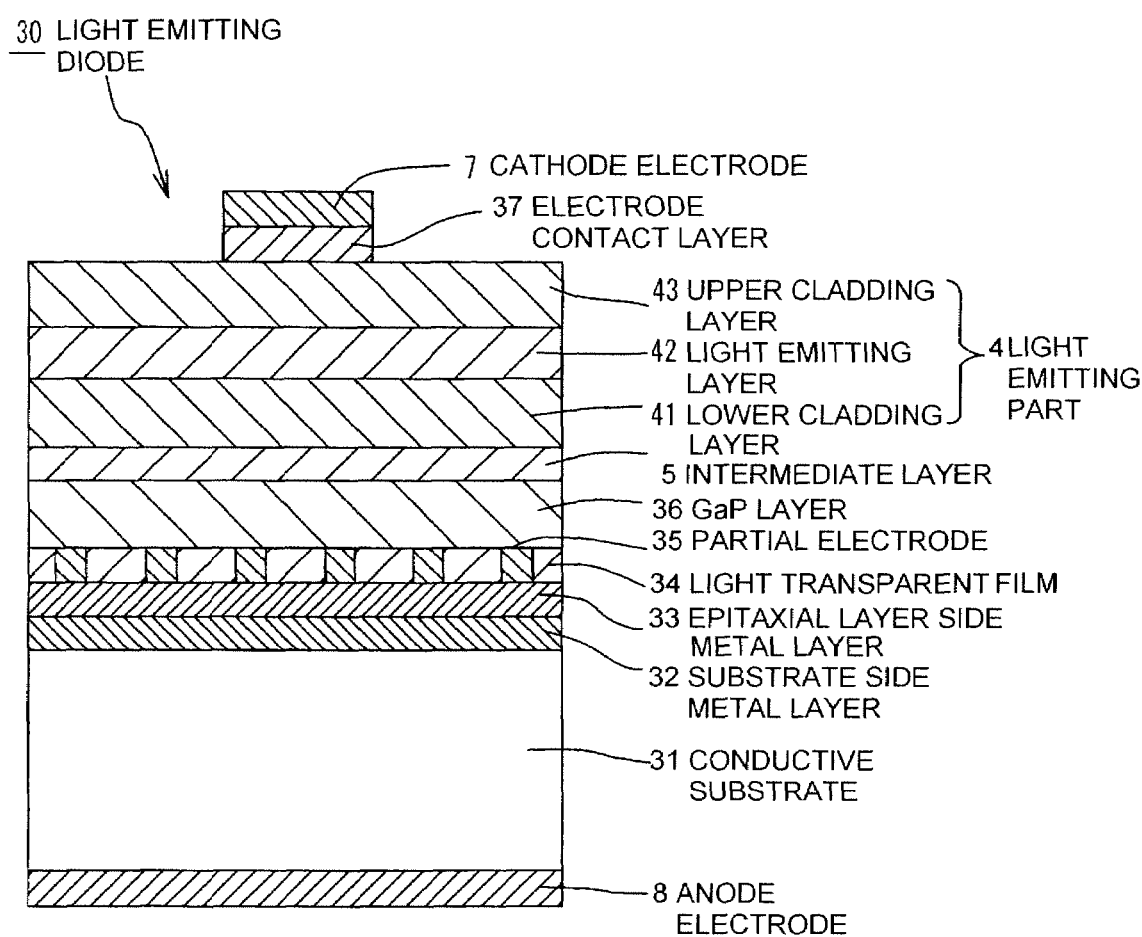
FIG. 5 is a schematic cross sectional view of a light emitting diode in a third preferred embodiment according to the present invention.

FIG. 5 is a schematic cross sectional view of a light emitting diode in the third preferred embodiment according to the present invention.

A light emitting diode 30 comprises an epitaxial layer including a light emitting part 4, a conductive substrate 31, metal layers (a substrate side metal layer 32, an epitaxial layer side metal layer 33) for joining the epitaxial layer and the conductive substrate 31, a cathode electrode 7 formed on un upper surface of the epitaxial layer, and an anode electrode 8 formed on a lower surface of the conductive substrate 31. Namely, the epitaxial layer including the light emitting part 4 is joined with the conductive substrate 31 via the metal layers. The light emitting diode 30 is energized by the cathode electrode 7 and the anode electrode 8.

The epitaxial layer comprises a GaP layer 36, an intermediate layer 5, the light emitting part 4 and an electrode contact layer 37. Under the GaP layer 36, a light transparent film 34 that is transparent with respect to an emitted light and a partial electrode 35 are formed. As the light transparent film 34, a silicon oxide film is used. The partial electrode 35 is ohmic-contacted with the p-type GaP layer 36, and connected to the epitaxial layer side metal layer 33 at a lower stage.

The conductive substrate 31 may be a material selected from a group consisting of Si, GaAs, and Cu. In the third preferred embodiment, a p-type silicon substrate is used. Further, the anode electrode 8 is formed on a back surface (lower surface) of the conductive substrate 31.

The GaP layer 36 has a conductivity of p-type, a thickness of about 1 µm, and a p-type dopant concentration of about $4.5 \times 10^{18}$ cm$^{-3}$. The concentrations of the hydrogen, carbon, and oxygen in the GaP layer 36 are controlled to have the same values as those of the current-spreading layer shown in TABLE 1.

The electrode contact layer 37 comprises an n-type $(Al_xGa_{1-x})_yIn_{1-y}P$ (x≈0, y≈0.51, and a dopant is Te in the third preferred embodiment), and a dopant concentration is $2 \times 10^{18}$ cm$^{-3}$. The cathode electrode 7 is formed on the upper surface of the electrode contact layer 37, and other part of the cathode electrode 7 than a part beneath the electrode contact layer 37 is removed. This is to prevent a decrease in an efficiency of taking out a light due to the electrode contact layer 37 having a light absorbing property.

The epitaxial layer side metal layer 33 comprises a plurality of metal layers including a gold (Au) layer. The epitaxial layer side metal layer 33 has a function for reflecting a light emitted to a lower direction from the light emitting layer 42 to an upper direction, and a function of an adhesive layer for joining with the substrate side metal layer 32.

The substrate side metal layer 32 comprises a metal multilayer including a gold layer similarly to the epitaxial layer side metal layer 33. Un upper surface of the substrate side metal layer 32 is joined with the epitaxial layer side metal layer 33 by metal-joining, and a lower surface of the substrate side metal layer 32 is ohmic-contacted with the conductive substrate 31.

The light emitting part 4 comprises the p-type lower cladding layer 41, the light emitting layer 42, and the n-type upper cladding layer 43 similarly to that in the first preferred embodiment. The lower cladding layer 41 comprises a p-type $(Al_xGa_{1-x})_yIn_{1-y}P$ (x≈0.7, y≈0.51, and a dopant is Mg in the third preferred embodiment), in which a dopant concentration is about $4 \times 10^{17}$ cm$^{-3}$ and a thickness is about 0.5 µm. The light emitting layer 42 has a MQW structure comprising $(Al_xGa_{1-x})_yIn_{1-y}P$. The concentrations of the hydrogen, carbon, and oxygen in the light emitting part 4 are controlled to have the same values as those of the light emitting part shown in TABLE 1.

In the third preferred embodiment, as the light emitting layer 42 having a multiquantum well structure, $(Al_xGa_{1-x})_yIn_{1-y}P$ (x≈0.5, y≈0.51 in this example) and $(Al_xGa_{1-x})_yIn_{1-y}P$ (x≈0, y≈0.51 in this example) are used, and a peak wave length of a light emitting energy spectrum of the light emitting diode 30 is about 635 nm. This light emitting layer 42 is grown without doping (i.e. undoped).

The upper cladding layer 43 comprises an n-type $(Al_xGa_{1-x})_yIn_{1-y}P$ (x≈0.7, y≈0.51, and a dopant is Te) with a dopant concentration of about $1 \times 10^{17}$ cm$^{-3}$ and a thickness of about 2 µm.

The intermediate layer 5 comprises a p-type $(Al_xGa_{1-x})_yIn_{1-y}P$ (x≈0, y≈0.7, and dopants are Mg and Te) with a Mg (p-type dopant) concentration of about $5 \times 10^{18}$ cm$^{-3}$, a Te concentration of about $5 \times 10^{17}$ cm$^{-3}$, and a thickness of about 20 nm. The concentrations of the hydrogen, carbon, and oxygen of the intermediate layer 5 are controlled to have the same values as those of the intermediate layer shown in TABLE 1.

In the third preferred embodiment, a light emitting diode chip having a surface size of about 300 µm×300 µm and a light emitting diode chip having a surface size of 1 mm×1 mm are manufactured, respectively. After mounting each of the light emitting diodes on a metal stem, the measurement of a light output and a forward voltage and the reliability test were carried out. As a result, the light output of about 6 mW that is a very high value can be obtained. The forward voltage is about 1.90V that is considered as a good value. Further, the alteration in the light output and the forward voltage was not observed after the reliability test. Therefore, the light emitting diode 30 has excellent characteristics compared with the conventional AlGaInP based light emitting diode in which the light output is reduced by about 30% compared with the initial values.

As the light emitting diode according to the present invention has a high light output, a low power consumption, and a high reliability, the application to a signal apparatus, an exterior lamp for a vehicle, a backlight module for a liquid crystal television or the like is possible.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting diode comprising:
   a first conductivity type GaAs substrate;
   a Bragg reflection layer comprising at least two kinds of materials having different Al compositions, each of which is selected from a first conductivity type $Al_{x0}Ga_{1-x0}As$ (0≦x0≦1);
   a lower cladding layer comprising a first conductivity type $(Al_{x1}Ga_{1-x1})_{y1}In_{1-y1}P$ (0≦x1≦1, 0.4≦y1≦0.6);
   a light emitting layer comprising an intrinsic semiconductor layer having a multiquantum well structure comprising an $(Al_{x2}Ga_{1-x2})_{y2}In_{1-y2}P$ (0≦x2≦1, 0.4≦y2≦0.6);
   an upper cladding layer comprising a second conductivity type $(Al_{x3}Ga_{1-x3})_{y3}In_{1-y3}P$ (0≦x3≦1, 0.4≦y3≦0.6); and
   a current spreading layer comprising a second conductivity type GaP layer;
   wherein a first hydrogen concentration is not more than $2 \times 10^{17}$ cm$^{-3}$, a first carbon concentration is not more than $2 \times 10^{16}$ cm$^{-3}$, and a first oxygen concentration is not more than $2 \times 10^{16}$ cm$^{-3}$ in each of the lower cladding layer, the light emitting layer, and the upper cladding layer, and a second hydrogen concentration is not more than $5 \times 10^{17}$ cm$^{-3}$, a second carbon concentration is not more than $5 \times 10^{17}$ cm$^{-3}$, and a second oxygen concentration is not more than $2 \times 10^{16}$ cm$^{-3}$ in a partial region or in a total region of the current-spreading layer.

2. The light emitting diode according to claim 1, further comprising:
   an intermediate layer provided between the upper cladding layer and the current-spreading layer, the intermediate layer comprising $(Al_{x7}Ga_{1-x7})_{y7}In_{1-y7}P$ (0≦x7≦1, 0≦y7≦1) doped with a second conductivity type dopant having a concentration higher than that of a second conductivity type dopant in the upper cladding layer;
   wherein a third hydrogen concentration is not more than $1 \times 10^{18}$ cm$^{-3}$, a third carbon concentration is not more than $1 \times 10^{18}$ cm$^{-3}$, and a third oxygen concentration is not more than $5 \times 10^{16}$ cm$^{-3}$ in the intermediate layer.

3. The light emitting diode according to claim 2, wherein:
the concentration of the second conductivity type dopant of the intermediate layer is not less than $5\times10^{17}$ cm$^{-3}$, and the intermediate layer further includes a first conductivity type dopant having a concentration lower than that of the second conductivity type dopant.

4. A light emitting diode comprising:
a first conductivity type GaAs substrate;
a Bragg reflection layer comprising at least two kinds of materials having different Al compositions, each of which is selected from a first conductivity type $(Al_{x4}Ga_{1-x4})_{y4}In_{1-y4}P$ ($0\leq x4\leq 1$, $0.4\leq y4\leq 0.6$);
a lower cladding layer comprising a first conductivity type $(Al_{x1}Ga_{1-x1})_{y1}In_{1-y1}P$ ($0\leq x1\leq 1$, $0.4\leq y1\leq 0.6$);
a light emitting layer comprising an intrinsic semiconductor layer having a multiquantum well structure comprising an $(Al_{x2}Ga_{1-x2})_{y2}In_{1-y2}P$ ($0\leq x2\leq 1$, $0.4\leq y2\leq 0.6$);
an upper cladding layer comprising a second conductivity type $(Al_{x3}Ga_{1-x3})_{y3}In_{1-y3}P$ ($0\leq x3\leq 1$, $0.4\leq y3\leq 0.6$); and
a current spreading layer comprising a second conductivity type GaP layer;
wherein a first hydrogen concentration is not more than $2\times10^{17}$ cm$^{-3}$, a first carbon concentration is not more than $2\times10^{16}$ cm$^{-3}$, and a first oxygen concentration is not more than $2\times10^{16}$ cm$^{-3}$ in each of the lower cladding layer, the light emitting layer, and the upper cladding layer, and a second hydrogen concentration is not more than $5\times10^{17}$ cm$^{-3}$, a second carbon concentration is not more than $5\times10^{17}$ cm$^{-3}$, and a second oxygen concentration is not more than $2\times10^{16}$ cm$^{-3}$ in a partial region or in a total region of the current-spreading layer.

5. A light emitting diode comprising:
a first conductivity type GaAs substrate;
a Bragg reflection layer comprising materials selected from a first conductivity type $Al_{x5}Ga_{1-x5}As$ ($0\leq x5\leq 1$) and a first conductivity type $(Al_{x6}Ga_{1-x6})_{y6}In_{1-y6}P$ ($0\leq x6\leq 1$, $0.4\leq y6\leq 0.6$);
a lower cladding layer comprising a first conductivity type $(Al_{x1}Ga_{1-x1})_{y1}In_{1-y1}P$ ($0\leq x1\leq 1$, $0.4\leq y1\leq 0.6$);
a light emitting layer comprising an intrinsic semiconductor layer having a multiquantum well structure comprising an $(Al_{x2}Ga_{1-x2})_{y2}In_{1-y2}P$ ($0\leq x2\leq 1$, $0.4\leq y2\leq 0.6$);
an upper cladding layer comprising a second conductivity type $(Al_{x3}Ga_{1-x3})_{y3}In_{1-y3}P$ ($0\leq x3\leq 1$, $0.4\leq y3\leq 0.6$); and
a current spreading layer comprising a second conductivity type GaP layer;
wherein a first hydrogen concentration is not more than $2\times10^{17}$ cm$^{-3}$, a first carbon concentration is not more than $2\times10^{16}$ cm$^{-3}$, and a first oxygen concentration is not more than $2\times10^{16}$ cm$^{-3}$ in each of the lower cladding layer, the light emitting layer, and the upper cladding layer, and a second hydrogen concentration is not more than $5\times10^{17}$ cm$^{-3}$, a second carbon concentration is not more than $5\times10^{17}$ cm$^{-3}$, and a second oxygen concentration is not more than $2\times10^{16}$ cm$^{-3}$ in a partial region or in a total region of the current-spreading layer.

6. A light emitting diode comprising:
an n-type GaAs substrate;
a Bragg reflection layer comprising at least two kinds of materials having different Al compositions, each of which is selected from an n-type $Al_{x0}Ga_{1-x0}As$ ($0\leq x0\leq 1$);
a lower cladding layer comprising an n-type $(Al_{x1}Ga_{1-x1})_{y1}In_{1-y1}P$ ($0\leq x1\leq 1$, $0.4\leq y1\leq 0.6$);
a light emitting layer comprising an intrinsic semiconductor layer having a multiquantum well structure comprising an $(Al_{x2}Ga_{1-x2})_{y2}In_{1-y2}P$ ($0\leq x2\leq 1$, $0.4\leq y2\leq 0.6$);
an upper cladding layer comprising a Mg-doped p-type $(Al_{x3}Ga_{1-x3})_{y3}In_{1-y3}P$ ($0\leq x3\leq 1$, $0.4\leq y3\leq 0.6$); and
a current spreading layer comprising a Mg-doped p-type GaP layer;
wherein a first hydrogen concentration is not more than $2\times10^{17}$ cm$^{-3}$, a first carbon concentration is not more than $2\times10^{16}$ cm$^{-3}$, and a first oxygen concentration is not more than $2\times10^{16}$ cm$^{-3}$ in each of the lower cladding layer, the light emitting layer, and the upper cladding layer, and a second hydrogen concentration is not more than $5\times10^{17}$ cm$^{-3}$, a second carbon concentration is not more than $5\times10^{17}$ cm$^{-3}$, and a second oxygen concentration is not more than $2\times10^{16}$ cm$^{-3}$ in a partial region or in a total region of the current-spreading layer.

7. The light emitting diode according to claim 6, further comprising:
an intermediate layer provided between the upper cladding layer and the current-spreading layer, the intermediate layer comprising $(Al_{x7}Ga_{1-x7})_{y7}In_{1-y7}P$ ($0\leq x7\leq 1$, $0\leq y7\leq 1$) doped with Mg to have a Mg concentration higher than that in the upper cladding layer;
wherein a third hydrogen concentration is not more than $1\times10^{18}$ cm$^{-3}$, a third carbon concentration is not more than $1\times10^{18}$ cm$^{-3}$, and a third oxygen concentration is not more than $5\times10^{17}$ cm$^{-3}$ in the intermediate layer.

8. The light emitting diode according to claim 7, wherein:
the intermediate layer includes at least one element selected from a group consisting of Si, Se, and Te as an n-type dopant, and a total of n-type dopant concentration is not less than $5\times10^{17}$ cm$^{-3}$ as well as lower than the Mg concentration.

9. A light emitting diode comprising:
an n-type GaAs substrate;
a Bragg reflection layer comprising at least two kinds of materials having different Al compositions, each of which is selected from an n-type $(Al_{x4}Ga_{1-x4})_{y4}In_{1-y4}P$ ($0\leq x4\leq 1$, $0.4\leq y4\leq 0.6$);
a lower cladding layer comprising an n-type $(Al_{x1}Ga_{1-x1})_{y1}In_{1-y1}P$ ($0\leq x1\leq 1$, $0.4\leq y1\leq 0.6$);
a light emitting layer comprising an intrinsic semiconductor layer having a multiquantum well structure comprising an $(Al_{x2}Ga_{1-x2})_{y2}In_{1-y2}P$ ($0\leq x2\leq 1$, $0.4\leq y2\leq 0.6$);
an upper cladding layer comprising a Mg-doped p-type $(Al_{x3}Ga_{1-x3})_{y3}In_{1-y3}P$ ($0\leq x3\leq 1$, $0.4\leq y3\leq 0.6$); and
a current spreading layer comprising a Mg-doped p-type GaP layer;
wherein a first hydrogen concentration is not more than $2\times10^{17}$ cm$^{-3}$, a first carbon concentration is not more than $2\times10^{16}$ cm$^{-3}$, and a first oxygen concentration is not more than $2\times10^{16}$ cm$^{-3}$ in each of the lower cladding layer, the light emitting layer, and the upper cladding layer, and a second hydrogen concentration is not more than $5\times10^{17}$ cm$^{-3}$, a second carbon concentration is not more than $5\times10^{17}$ cm$^{-3}$, and a second oxygen concentration is not more than $2\times10^{16}$ cm$^{-3}$ in a partial region or in a total region of the current-spreading layer.

10. A light emitting diode comprising:
an n-type GaAs substrate;
a Bragg reflection layer comprising materials selected from an n-type $Al_{x5}Ga_{1-x5}As$ ($0\leq x5\leq 1$) and an n-type $(Al_{x6}Ga_{1-x6})_{y6}In_{1-y6}P$ ($0\leq x6\leq 1$, $0.4\leq y6\leq 0.6$);
a lower cladding layer comprising an n-type $(Al_{x1}Ga_{1-x1})_{y1}In_{1-y1}P$ ($0\leq x1\leq 1$, $0.4\leq y1\leq 0.6$);

a light emitting layer comprising an intrinsic semiconductor layer having a multiquantum well structure comprising an $(Al_{x2}Ga_{1-x2})_{y2}In_{1-y2}P$ ($0 \leq x2 \leq 1$, $0.4y2 \leq 0.6$);

an upper cladding layer comprising a Mg-doped p-type $(Al_{x3}Ga_{1-x3})_{y3}In_{1-y3}P$ ($0 \leq x3 \leq 1$, $0.4 \leq y3 \leq 0.6$); and a current spreading layer comprising a Mg-doped p-type GaP layer;

wherein a first hydrogen concentration is not more than $2 \times 10^{17}$ cm$^{-3}$, a first carbon concentration is not more than $2 \times 10^{16}$ cm$^{-3}$, and a first oxygen concentration is not more than $2 \times 10^{16}$ cm$^{-3}$ in each of the lower cladding layer, the light emitting layer, and the upper cladding layer, and a second hydrogen concentration is not more than $5 \times 10^{17}$ cm$^{-3}$, a second carbon concentration is not more than $5 \times 10^{17}$ cm$^{-3}$, and a second oxygen concentration is not more than $2 \times 10^{16}$ cm$^{-3}$ in a partial region or in a total region of the current-spreading layer.

11. A light emitting diode comprising:

a conductive substrate;

a multilayered crystal layer comprising a plurality of compound semiconductor crystal layers joined with the conductive substrate via a metal layer, the multilayered crystal layer comprising:

a lower cladding layer comprising a first conductivity type $(Al_{x1}Ga_{1-x1})_{y1}In_{1-y1}P$ ($0 \leq x1 \leq 1$, $0.4 \leq y1 \leq 0.6$);

a light emitting layer comprising an intrinsic semiconductor layer having a multiquantum well structure comprising an $(Al_{x2}Ga_{1-x2})_{y2}In_{1-y2}P$ ($0 \leq x2 \leq 1$, $0.4 \leq y2 \leq 0.6$); and an upper cladding layer comprising a second conductivity type $(Al_{x3}Ga_{1-x3})_{y3}In_{1-y3}P$ ($0 \leq x3 \leq 1$, $0.4 \leq y3 \leq 0.6$), sequentially deposited from a side in vicinity of the conductive substrate; and wherein a hydrogen concentration is not more than $2 \times 10^{17}$ cm$^{-3}$, a carbon concentration is not more than $2 \times 10^{16}$ cm$^{-3}$, and an oxygen concentration is not more than $2 \times 10^{16}$ cm$^{-3}$ in each of the lower cladding layer, the light emitting layer, and the upper cladding layer.

12. The light emitting diode according to claim 11, further comprising:

a first conductivity type GaP layer provided between the conductive substrate and the lower cladding layer, wherein a hydrogen concentration is not more than $5 \times 10^{17}$ cm$^{-3}$, a carbon concentration is not more than $5 \times 10^{17}$ cm$^{-3}$, and an oxygen concentration is not more than $2 \times 10^{16}$ cm$^{-3}$ in at least a partial region of the GaP layer.

13. The light emitting diode according to claim 12 further comprising:

an intermediate layer provided between the GaP layer and the lower cladding layer, the intermediate layer comprising $(Al_{x7}Ga_{1-x7})_{y7}In_{1-y7}P$ ($0 \leq x7 \leq 1$, $0 \leq y7 \leq 1$) doped with a first conductivity type dopant having a concentration higher than that of a first conductivity type dopant in the lower cladding layer;

wherein a hydrogen concentration is not more than $1 \times 10^{18}$ cm$^{-3}$, a carbon concentration is not more than $1 \times 10^{18}$ cm$^{-3}$, and an oxygen concentration is not more than $5 \times 10^{16}$ cm$^{-3}$ in the GaP layer.

14. The light emitting diode according to claim 13, wherein:

the concentration of the first conductivity type dopant of the intermediate layer is not less than $5 \times 10^{17}$ cm$^{-3}$, and the intermediate layer further includes a second conductivity type dopant having a concentration lower than that of the first conductivity type dopant.

15. The light emitting diode according to claim 14, wherein:

the conductive substrate comprises a material selected from a group consisting of Si, GaAs and Cu.

16. A light emitting diode comprising:

a conductive substrate;

a light emitting part comprising:

a first conductivity type AlGaInP based lower cladding layer;

a light emitting layer comprising an intrinsic semiconductor layer having an AlGaInP based multiquantum well structure; and a second conductivity type AlGaInP based upper cladding layer;

wherein a hydrogen concentration is not more than $2 \times 10^{17}$ cm$^{-3}$, a carbon concentration is not more than $2 \times 10^{16}$ cm$^{-3}$, and an oxygen concentration is not more than $2 \times 10^{16}$ cm$^{-3}$ in each of the lower cladding layer, the light emitting layer, and the upper cladding layer.

* * * * *